United States Patent
Chen et al.

(12) 
(10) Patent No.: US 12,211,818 B2
(45) Date of Patent: Jan. 28, 2025

(54) MANUFACTURING METHOD OF SEMICONDUCTOR PACKAGE USING JIG

(71) Applicant: Taiwan Semiconductor Manufacturing Company, Ltd., Hsinchu (TW)

(72) Inventors: Chih-Hao Chen, Taipei (TW); Chih-Chien Pan, Taipei (TW); Pu Wang, Hsinchu (TW); Li-Hui Cheng, New Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/358,969

(22) Filed: Jul. 26, 2023

(65) Prior Publication Data
US 2023/0369283 A1    Nov. 16, 2023

Related U.S. Application Data

(62) Division of application No. 17/149,737, filed on Jan. 15, 2021, now Pat. No. 11,804,468.

(51) Int. Cl.
*H01L 23/00* (2006.01)
*H01L 21/48* (2006.01)
(Continued)

(52) U.S. Cl.
CPC .......... *H01L 24/75* (2013.01); *H01L 21/4882* (2013.01); *H01L 21/52* (2013.01);
(Continued)

(58) Field of Classification Search
CPC ............ H01L 21/4871; H01L 21/4867; H01L 21/6835; H01L 21/687; H01L 21/02697; H01L 21/68721; H01L 21/68735; H01L 21/68742; H01L 21/68778; H01L 21/68785; H01L 2221/68304;
(Continued)

(56) References Cited

U.S. PATENT DOCUMENTS 6,335,271 B1 *  1/2002  Fukuyama ............... H01L 24/11
                                                        438/615
7,022,211 B2 *  4/2006  Yoshioka .......... H01L 21/68721
                                                        204/224 R
(Continued)

*Primary Examiner* — David A Zarneke
(74) *Attorney, Agent, or Firm* — JCIPRNET

(57) ABSTRACT

A jig for manufacturing a semiconductor package includes a bottom piece and an upper piece. The bottom piece includes a base, a support plate, and at least one elastic connector. The support plate is located in a central region of the base. The at least one elastic connector is interposed between the support plate and the base. The upper piece includes a cap and outer flanges. The cap overlays the support plate when the upper piece is disposed on the bottom piece. The outer flanges are disposed at edges of the cap, connected with the cap. The outer flanges contact the base of the bottom piece (Continued)

when the upper piece is disposed on the bottom piece. The cap includes an opening which is a through hole. When the upper piece is disposed on the bottom piece, a vertical projection of the opening falls entirely on the support plate.

20 Claims, 39 Drawing Sheets

(51) Int. Cl.
    *H01L 21/52*     (2006.01)
    *H01L 21/67*     (2006.01)
    *H01L 23/40*     (2006.01)

(52) U.S. Cl.
    CPC .. *H01L 21/67121* (2013.01); *H01L 21/67126* (2013.01); *H01L 24/83* (2013.01); *H01L 2023/405* (2013.01); *H01L 2023/4062* (2013.01); *H01L 2023/4087* (2013.01); *H01L 2224/7555* (2013.01); *H01L 2224/83208* (2013.01)

(58) Field of Classification Search
    CPC ........... H01L 2221/68372; H01L 2221/68721; H05K 3/1225; H05K 3/1216; B05B 12/20
    See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,804,468 B2 * | 10/2023 | Chen ........................ H01L 25/50 |
| 11,996,345 B2 * | 5/2024 | Chen ................... H01L 23/3675 |

* cited by examiner

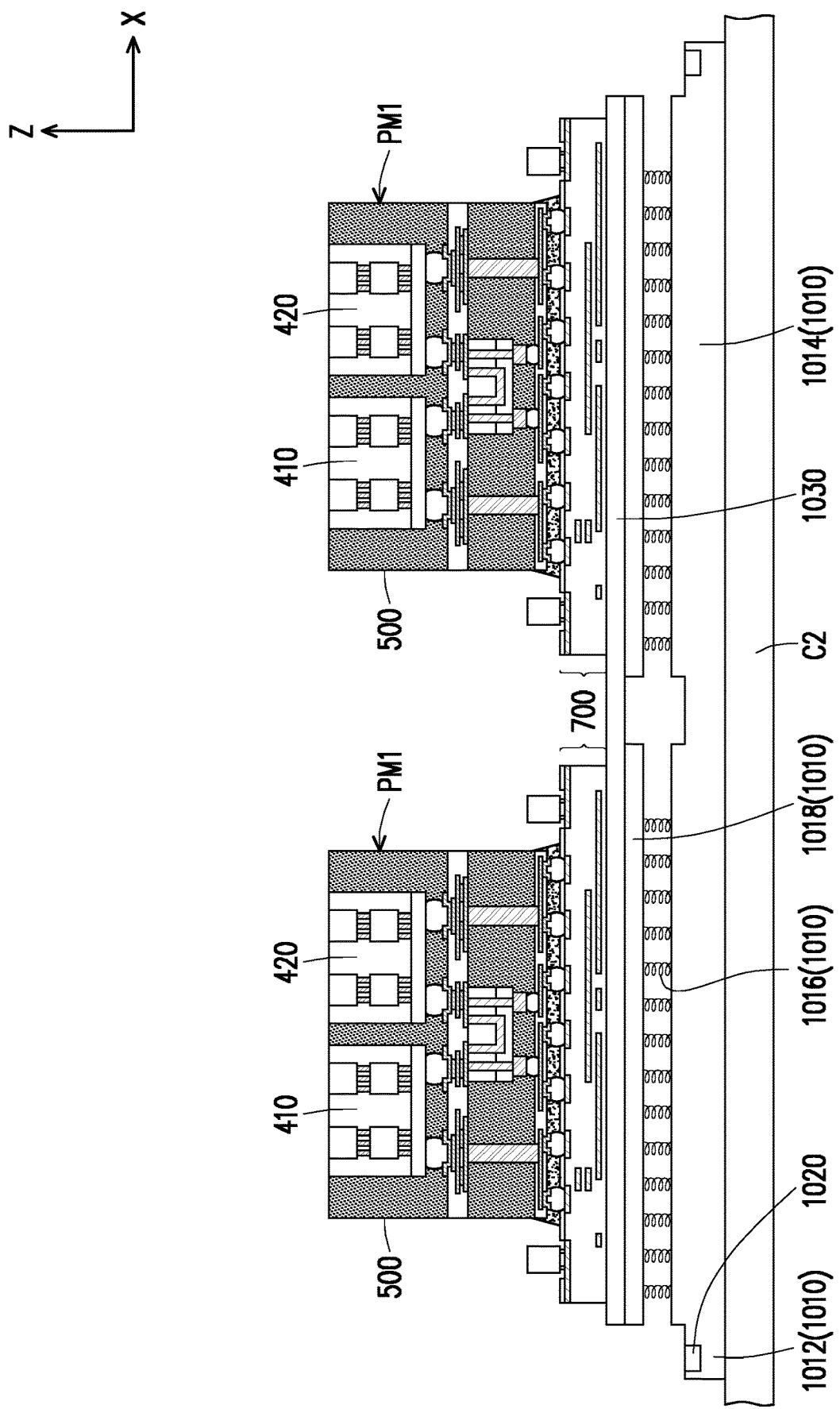

MANUFACTURING METHOD OF SEMICONDUCTOR PACKAGE USING JIG

CROSS-REFERENCE TO RELATED APPLICATION

This is a divisional application of and claims the priority benefit of U.S. application Ser. No. 17/149,737, filed on Jan. 15, 2021, now allowed. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1M are schematic cross-sectional views illustrating structures produced during a manufacturing process of a semiconductor package according to some embodiments of the disclosure.

DETAILED DESCRIPTION

Figure 1A:
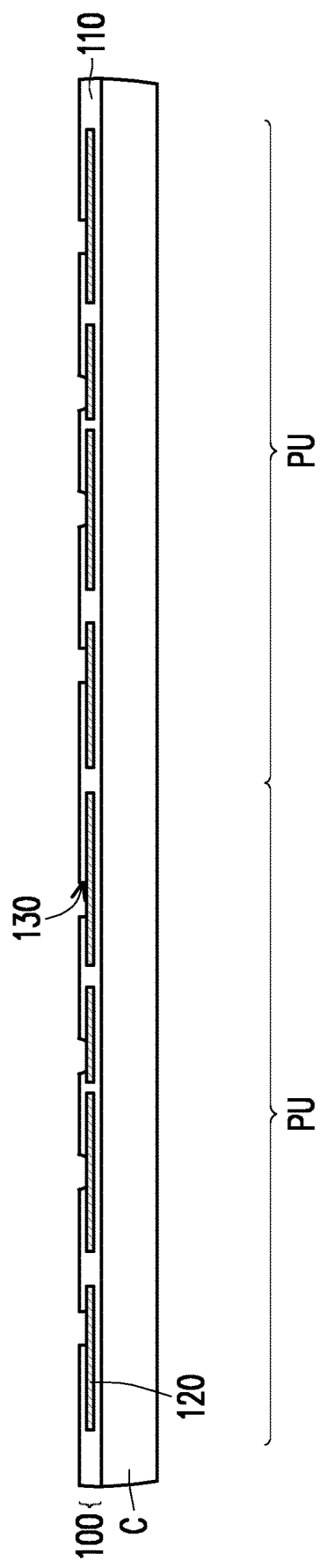

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1M are schematic cross-sectional views illustrating structures produced during a manufacturing process of a semiconductor package SP10 in accordance with some embodiments of the disclosure. Referring to FIG. 1A, a carrier C is provided. In some embodiments, the carrier C is a glass substrate, a metal plate, a plastic supporting board or the like, but other suitable substrate materials may be used as long as the materials are able to withstand the subsequent steps of the process. In some embodiments, a de-bonding layer (not shown) may be formed over the carrier C. In some embodiments, the de-bonding layer includes a light-to-heat conversion (LTHC) release layer, which facilitates peeling the carrier C away from the semiconductor package when required by the manufacturing process.

In some embodiments, an outer redistribution layer 100 is formed on the carrier C. In some embodiments, the outer redistribution layer 100 includes dielectric layers 110 alternately stacked with one or more metallization tiers 120. In some embodiments, the dielectric layers 110 include at least two dielectric layers. The metallization tier 120 includes routing conductive traces sandwiched between pairs of adjacent dielectric layers 110. In some embodiments, a material of the dielectric layers 110 includes polyimide, epoxy resin, acrylic resin, phenol resin, benzocyclobutene (BCB), polybenzooxazole (PBO), any other suitable polymer-based dielectric material, or a combination thereof. The dielectric layers 110 may be formed by suitable fabrication techniques such as spin-on coating, chemical vapor deposition (CVD), or the like. In some embodiments, a material of the metallization tier 120 includes copper, aluminum, or the like. In some embodiments, the material of the metallization tier 120 includes copper. Throughout the description, the term "copper" is intended to include substantially pure elemental copper, copper containing unavoidable impurities, and copper alloys containing elements such as tantalum, indium, tin, zinc, manganese, chromium, titanium, germanium, strontium, platinum, magnesium, aluminum, or zirconium. The metallization tier 120 may be formed by, for example, electroplating, deposition, and/or photolithography and etching. In some alternative embodiments, more metallization tiers 120 and more dielectric layers 110 than the ones illustrated in FIG. 1A may be formed depending on production requirements. In these embodiments, each metallization tier is sandwiched between a pair of consecutive dielectric layers. In some embodiments, the dielectric layer 110 further away from the carrier C is patterned to include openings 130 exposing portions of the metallization tier 120 further away from the carrier C. In some embodiments, the process may be performed at a reconstructed wafer level, so that multiple package units PU are processed in the form of a reconstructed wafer. In the cross-sectional view of FIG. 1A, two package units PU are shown for simplicity but, of course, this is for illustrative purposes only, and the disclosure is not limited by the number of package units PU being produced in the reconstructed wafer.

Figure 1B:
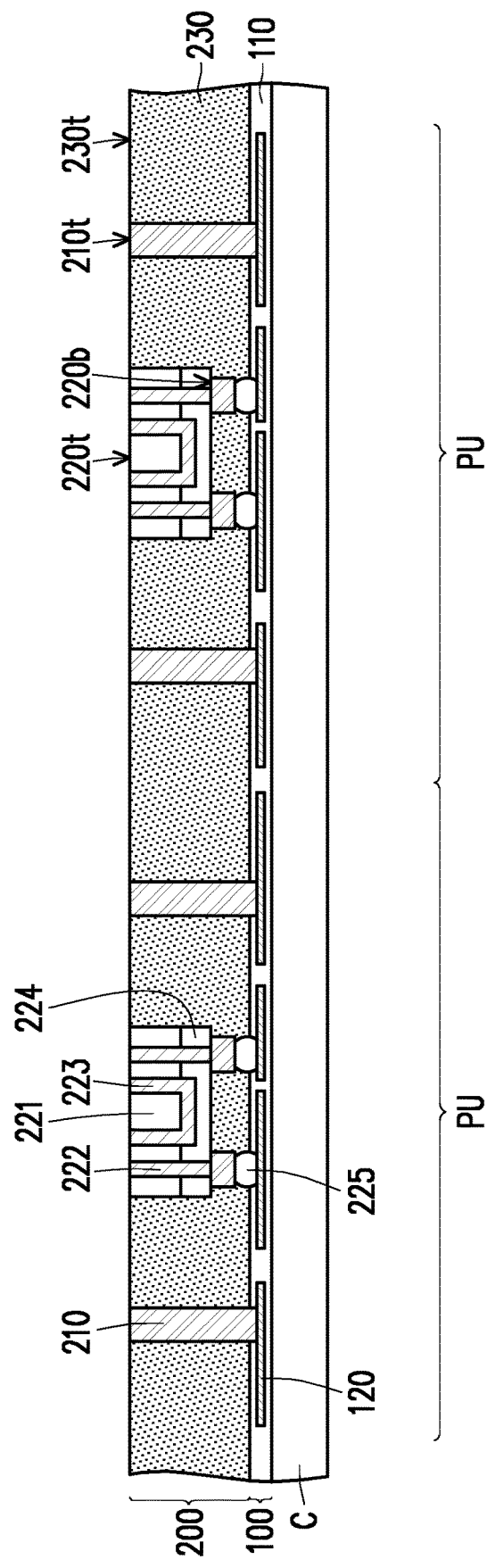

Referring to FIG. 1B, in some embodiments, TIVs 210 and a semiconductor bridge 220 are provided on the outer redistribution layer 100. In some embodiments, the TIVs 210 may be formed by filling the openings of a patterned mask (not shown) with conductive material. In some embodiments, the conductive material of the TIVs 210 includes cobalt (Co), tungsten (W), copper (Cu), titanium (Ti), tantalum (Ta), aluminum (Al), zirconium (Zr), hafnium (Hf), a combination thereof, or other suitable metallic materials. In some embodiments, the conductive material may be formed by a plating process. The plating process may be, for example, electro-plating, electroless-plating, immersion plating, or the like. In some embodiments, the conductive material may be deposited on a seed layer (not shown). In some embodiments, the formation of the seed layer may be skipped, as the metallization tiers 120 can seed the deposition of the conductive material. However, the disclosure is not limited thereto. In some alternative embodiments, other suitable methods may be utilized to form the TIVs 210. For example, pre-fabricated TIVs 210 (e.g., pre-fabricated conductive pillars) may be picked-and-placed and bonded onto the outer redistribution layer 100.

In some embodiments, the semiconductor bridge 220 is disposed on the outer redistribution layer 100 in between the TIVs 210. The semiconductor bridge 220 is bonded to some of the routing conductive traces of the metallization tier 120. In some embodiments, the semiconductor bridge 220 includes a semiconductor substrate 221, having through semiconductor vias (TSVs) 222 and interconnection conductive patterns 223 formed therethrough. A dielectric layer 224 may be disposed at a bottom surface 220b of the semiconductor bridge 220, closer to the outer redistribution layer 100. The semiconductor substrate 221 may be made of suitable semiconductor materials, such as semiconductor materials of the groups III-V of the periodic table. In some embodiments, the semiconductor substrate 221 includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. The interconnection conductive patterns 223 are in electrical contact with conductive terminals 225 formed on the dielectric layer 224 at the bottom surface 220b of the semiconductor bridge 220. The conductive terminals 225 may be micro-bumps. For example, the conductive terminals 225 may include a conductive post and a solder cap disposed on the conductive post. In some embodiments, the conductive posts may be copper posts. However, the disclosure is not limited thereto, and other conductive structures such as solder bumps or metallic bumps (e.g., gold bumps) may also be used as the conductive terminals 225. In some embodiments, the semiconductor bridge 220 is disposed with the bottom surface 220b directed towards the outer redistribution layer 100, so that the conductive terminals 225 can be bonded to the metallization tier 120. The conductive terminals 225 may be bonded to the metallization tier 120 through a reflow process, for example.

In some embodiments, an encapsulant 230 is formed on the outer redistribution layer 100, encapsulating the TIVs 210 and the semiconductor bridge 220. In some embodiments, the encapsulant 230 is formed through an over-molding process, for example, through a compression molding process. The encapsulant 230 may initially cover the TIVs 210 and the top surface 220t of the semiconductor bridge 220. In some embodiments, a material of the encapsulant 230 includes a molding compound, a polymeric material, such as polyimide, epoxy resin, acrylic resin, phenol resin, benzocyclobutene (BCB), polybenzooxazole (PBO), a combination thereof, or other suitable polymer-based dielectric materials. In some embodiments, the encapsulant 230 may be formed through an over-molding process, initially covering the TIVs 210 and the semiconductor bridge 220, and may be subsequently thinned until the TIVs 210 and the top surface 220t of the semiconductor bridge 220 are exposed. For example, a planarization process may be performed removing portions of the encapsulant 230 and, if needed, of the semiconductor bridge 220 and/or of the TIVs 210 from the side of the top surfaces 220t, 210t. In some embodiments, the planarization of the encapsulant 230 includes performing a mechanical grinding process and/or a chemical mechanical polishing (CMP) process. Following planarization, the top surfaces 210t of the TIVs 210, the top surface 220t of the semiconductor bridge 220, and the top surface 230t of the encapsulant 230 may be substantially flush with respect to each other (be at substantially the same level height, coplanar with respect to each other). In some embodiments, the TIVs 210, the semiconductor bridge 220, and the encapsulant 230 are considered parts of a bridging layer 200 stacked on the outer redistribution layer 100. That is, the semiconductor bridge 220 and the TIVs 210 are embedded in the bridging layer 200.

Figure 1C:
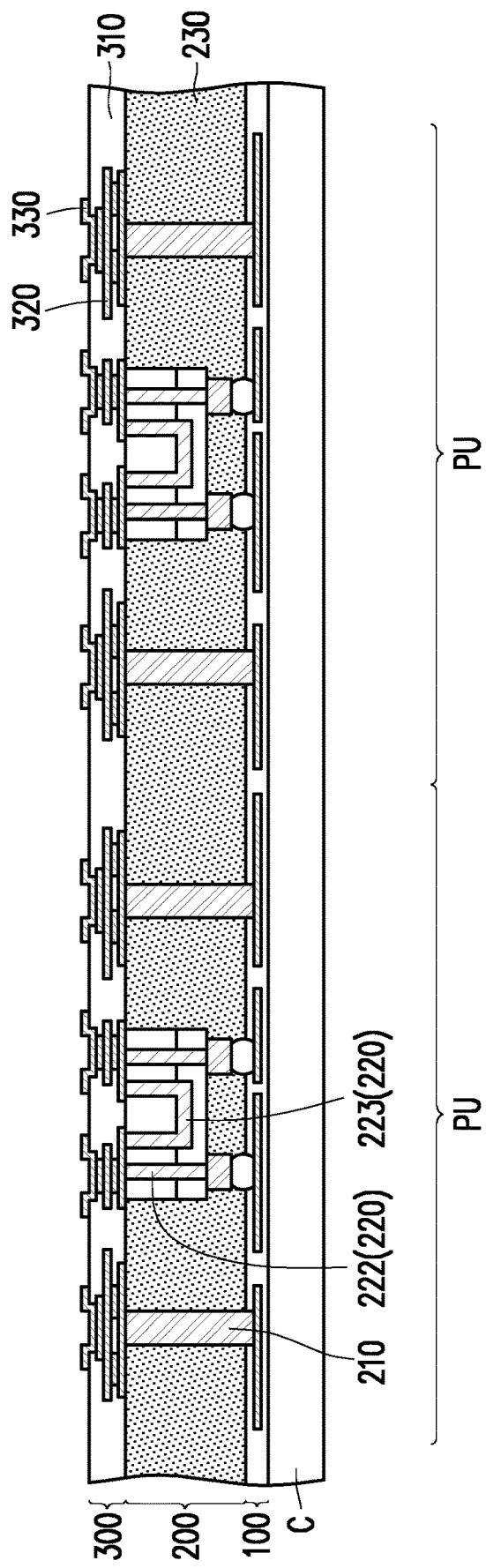

Referring to FIG. 1C, an inner redistribution layer 300 is formed on the bridging layer 200. The inner redistribution layer 300 includes dielectric layers 310, one or more metallization tiers 320, and, optionally, under-bump metallurgies 330. The inner redistribution layer 300 may have a similar structure and be formed following similar processes as the ones previously described for the outer redistribution layer 100. In some embodiments, the (uppermost) dielectric layer 310 is patterned to expose the underlying metallization tier 320. The under-bump metallurgies 330 are optionally conformally formed in the openings of the (uppermost) dielectric layer 310 exposing the metallization tier 320, and may further extend over portions of the exposed surface of the (uppermost) dielectric layer 310. In some embodiments, the under-bump metallurgies 330 include multiple stacked layers of conductive materials. For example, the under-bump metallurgies 330 may include one or more metallic layers stacked on a seed layer. In some embodiments, the outer redistribution layer 100, the bridging layer 200, and the inner redistribution layer 300 may collectively be referred to as a redistribution structure.

Figure 1D:
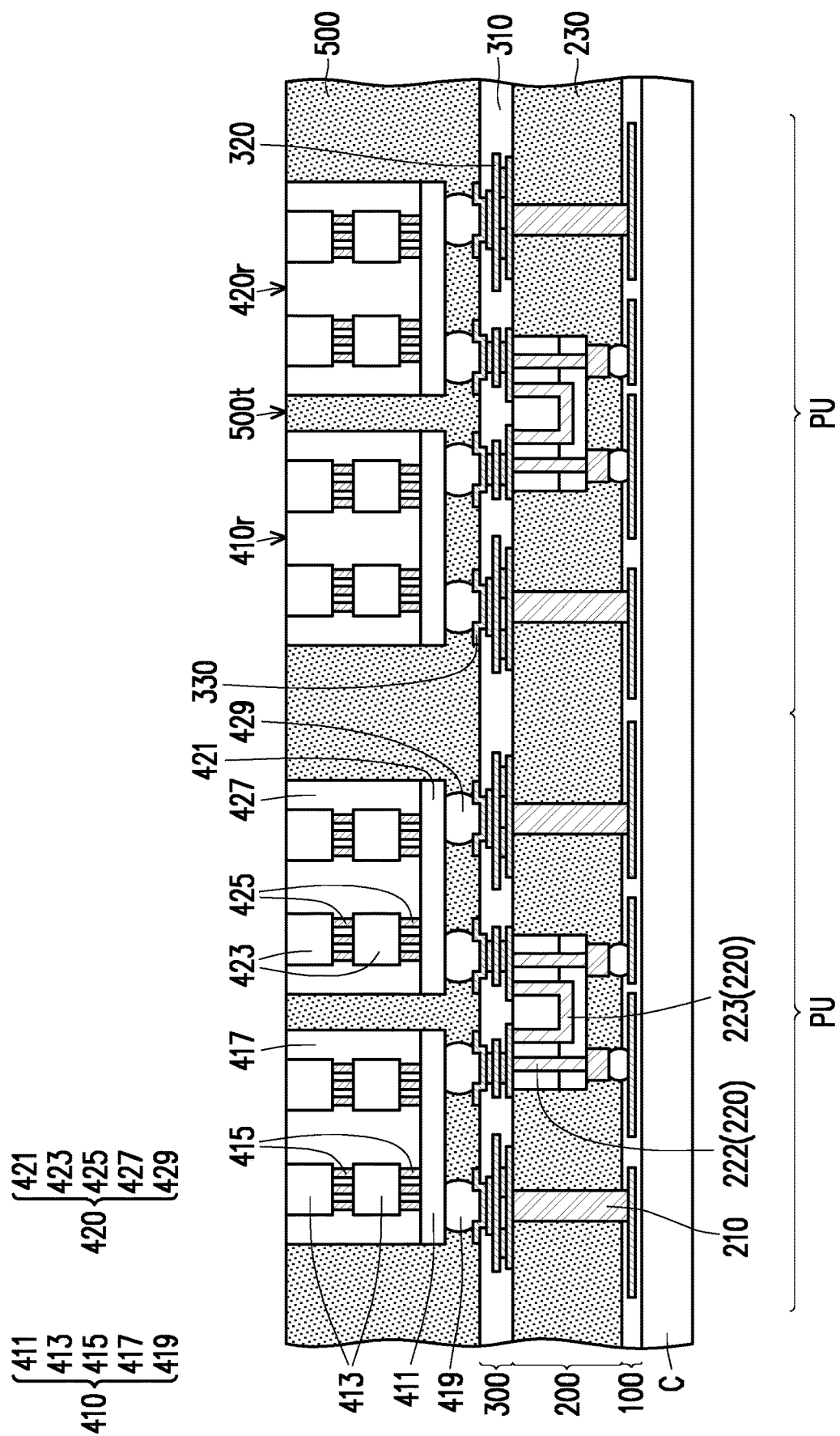

Referring to FIG. 1D, in some embodiments, semiconductor dies 410, 420 are disposed side by side over the inner redistribution layer 300 with a pick-and-place process. In some embodiments, the semiconductor dies 410, 420 are encapsulated chips. For example, the semiconductor die 410 may include a base chip 411 having one or more stacks of chips 413 bonded thereon. The chips 413 may be vertically stacked, and interconnected within the stacks by micro-bumps 415. An encapsulant 417 may be disposed on the base chip 411 to encapsulate the stacks of chips 413 and the micro-bumps 415. Connectors 419 may be disposed on the base chip 411 at an opposite side with respect to the chips 413. The semiconductor die 420 may have a similar structure as the semiconductor die 410, including a base chip 421, stacked chips 423 interconnected by micro-bumps 425, an encapsulant 427 encapsulating the chips 423 and the micro-bumps 425, and connectors 429.

In some embodiments, the semiconductor dies 410, 420 are placed on the inner redistribution layer 300 with the side of the base chips 411, 421 having the connectors 419, 429 formed thereon directed towards the inner redistribution layer 300. Rear surfaces 410r, 420r of the semiconductor dies 410, 420 may include the rear surfaces of the topmost chips 413, 423 of the stacks and the top surfaces of the encapsulants 417, 427. In some embodiments, the semiconductor dies 410, 420 included in a semiconductor package may have different sizes, include different components, and/or include components of different sizes. For example, the semiconductor dies 410, 420 may differ for the number of chips 413, 423 included, the types of stacked chips 413, 423 or base chips 411, 421 included, and so on. Each semiconductor die 410, 420 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or both of the semiconductor dies 410, 420 may be memory dies.

In some embodiments, the interconnection conductive patterns 223 of the semiconductor bridge 220 electrically connect the semiconductor dies 410 and 420 of a same package unit PU. That is, electrical connection between the semiconductor dies 410 and 420 is established through the inner redistribution layer 300 and the interconnection conductive patterns 223. In some embodiments, the inner redistribution layer 300 does not directly interconnect the semiconductor dies 410, 420. In some embodiments, the semiconductor bridge 220 connects at least one conductive trace of the metallization tier 320 electrically connected to the semiconductor die 410 to another conductive trace of the metallization tier 320 connected to the semiconductor die 420. In some embodiments, the semiconductor bridge 220 connects one or more conductive traces overlapped to the semiconductor die 410 with one or more conductive traces overlapped to the semiconductor die 420. In some embodiments, where a gap exists between adjacent semiconductor dies 410, 420, the semiconductor bridge 220 extends over such gap. In some embodiments, the semiconductor bridge 220 functions as an interconnecting structure for adjacent semiconductor dies 410, 420 and provides shorter electrical connection paths between the adjacent semiconductor dies 410, 420.

In some embodiments, an encapsulant 500 is formed over the inner redistribution layer 300 to encapsulate the semiconductor dies 410, 420. The encapsulant 500 laterally encircles the semiconductor dies 410, 420, extending also in the gaps in between the semiconductor dies 410, 420. In some embodiments, the material of the encapsulant 500 may be selected as described above for the encapsulant 230. The encapsulant 500 may be formed by a sequence of over-molding and planarization steps. For example, the encapsulant 500 may be originally formed by a molding process (such as a compression molding process) or a spin-coating process to completely cover the semiconductor dies 410, 420. In some embodiments, the planarization of the encapsulant 500 includes performing a mechanical grinding process and/or a chemical mechanical polishing (CMP) process. In some embodiments, the planarization process is performed until the rear surfaces 410r, 420r of the semiconductor dies 410, 420 are exposed. In some embodiments, following the planarization process, the rear surfaces 410r, 420r of the semiconductor dies 410, 420 and the top surface 500t of the encapsulant 500 may be substantially at a same level height (be substantially coplanar) along the Z direction.

Figure 1E:
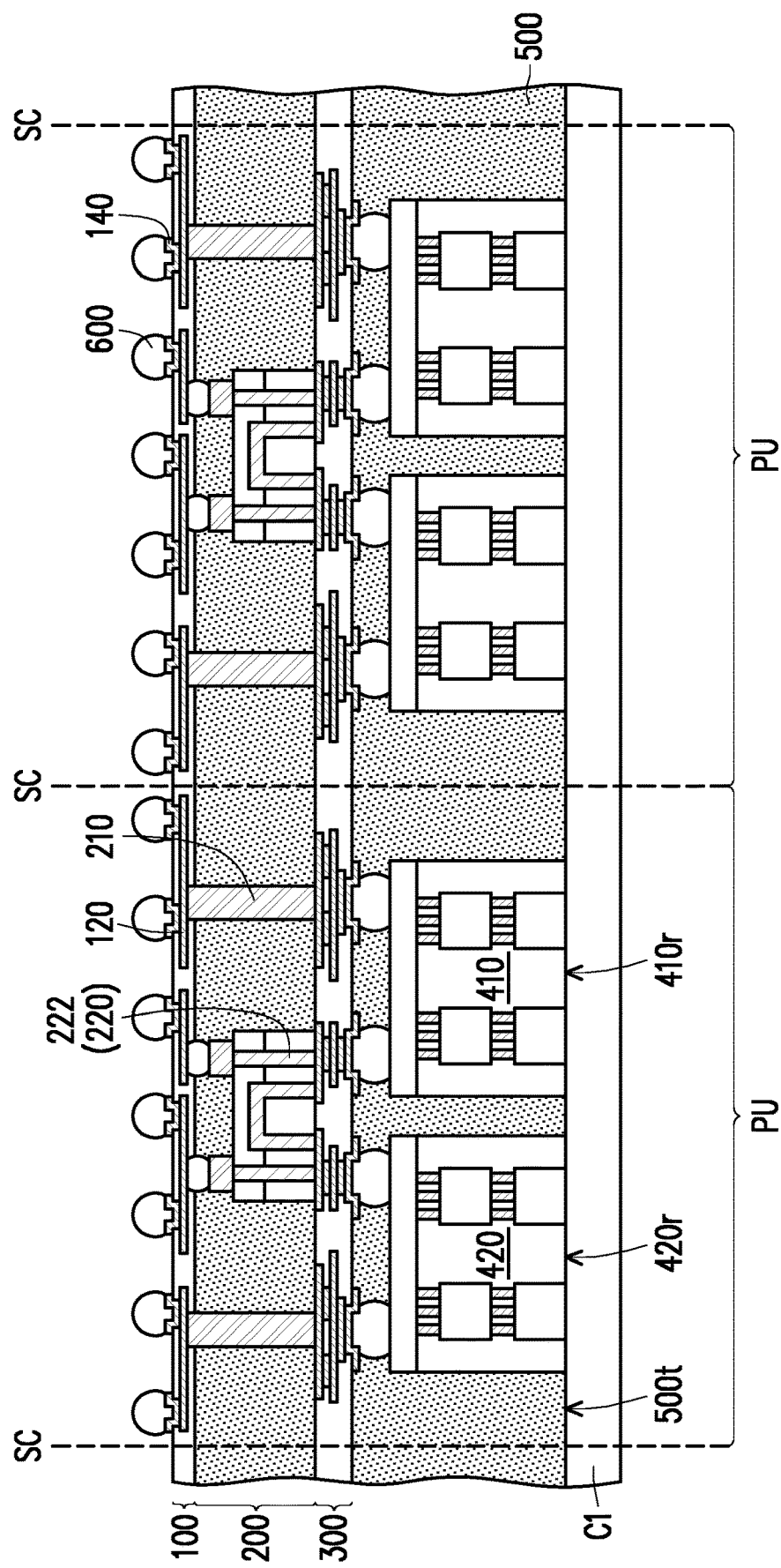

Referring to FIG. 1D and FIG. 1E, in some embodiments a second carrier C1 may be bonded on the side of the top surface 500t of the encapsulant, the reconstructed wafer may be overturned, and the original carrier C may be removed to expose the outer redistribution layer 100 for further processing. When a de-bonding layer (e.g., the LTHC release layer) is included, the de-bonding layer may be irradiated with a UV laser so that the carrier C and the de-bonding layer are easily peeled off from the reconstructed wafer. Nevertheless, the de-bonding process is not limited thereto, and other suitable de-bonding methods may be used in some alternative embodiments. Openings may be formed in outer redistribution layer 100 to expose the metallization tiers 120, at an opposite side with respect to the TIVs 210 and the semiconductor bridge 220. Under-bump metallurgies 140 may be optionally formed in the openings, in contact with the metallization tiers 120, before providing connective terminals 600 on the outer redistribution layer 100. The connective terminals 600 may be formed on the under-bump metallurgies 140 (if included) or the exposed portions of the metallization tier 120. In some embodiments, the connective terminals 600 are formed on the under-bump metallurgies 140, and are connected to the semiconductor die(s) 410, 420 via the outer redistribution layer 100, the semiconductor bridge 220 (e.g., through the TSVs 222), the TIVs 210, and the inner redistribution layer 300. In some embodiments, the connective terminals 600 are attached to the under-bump metallurgies 140 through a solder flux. In some embodiments, the connective terminals 600 are controlled collapse chip connection (C4) bumps. In some embodiments, the connective terminals 600 include a conductive material with low resistivity, such as Sn, Pb, Ag, Cu, Ni, Bi, or an alloy thereof.

Figure 1F:
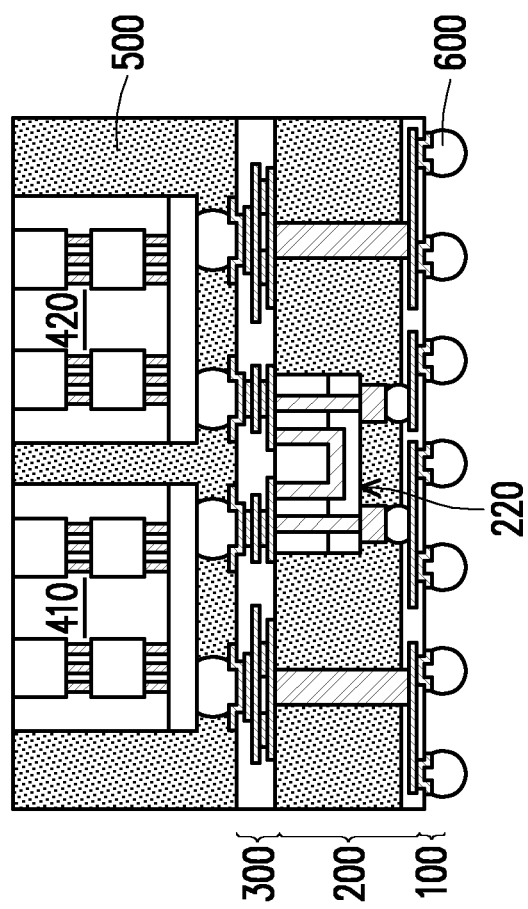

In some embodiments, referring to FIG. 1E and FIG. 1F, a singulation step is performed to separate the individual package units PU in a plurality of packaged dies 10, for example, by cutting along the scribe lanes SC arranged between individual package units PU. In some embodiments, the singulation process typically involves performing a wafer dicing process with a rotating blade and/or a laser beam. In some embodiments, the carrier C1 is separated from the packaged dies 10 following singulation.

Figure 1G:
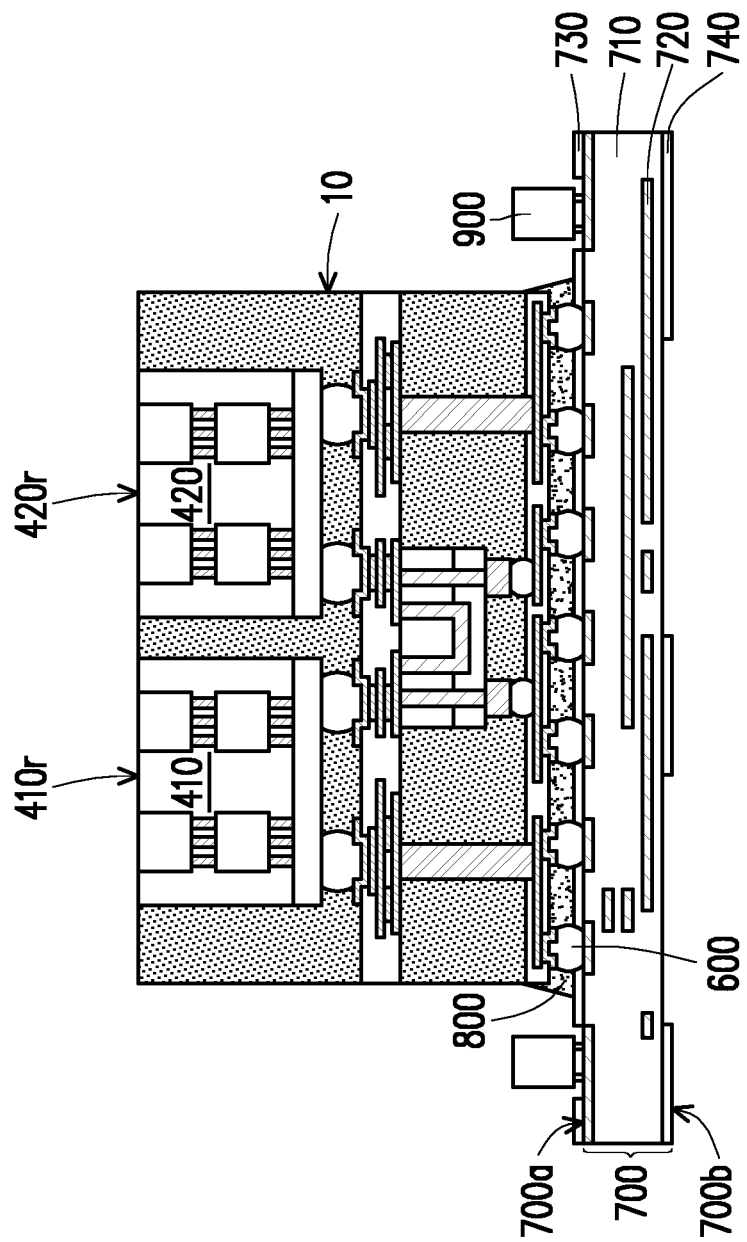
Figure 11:
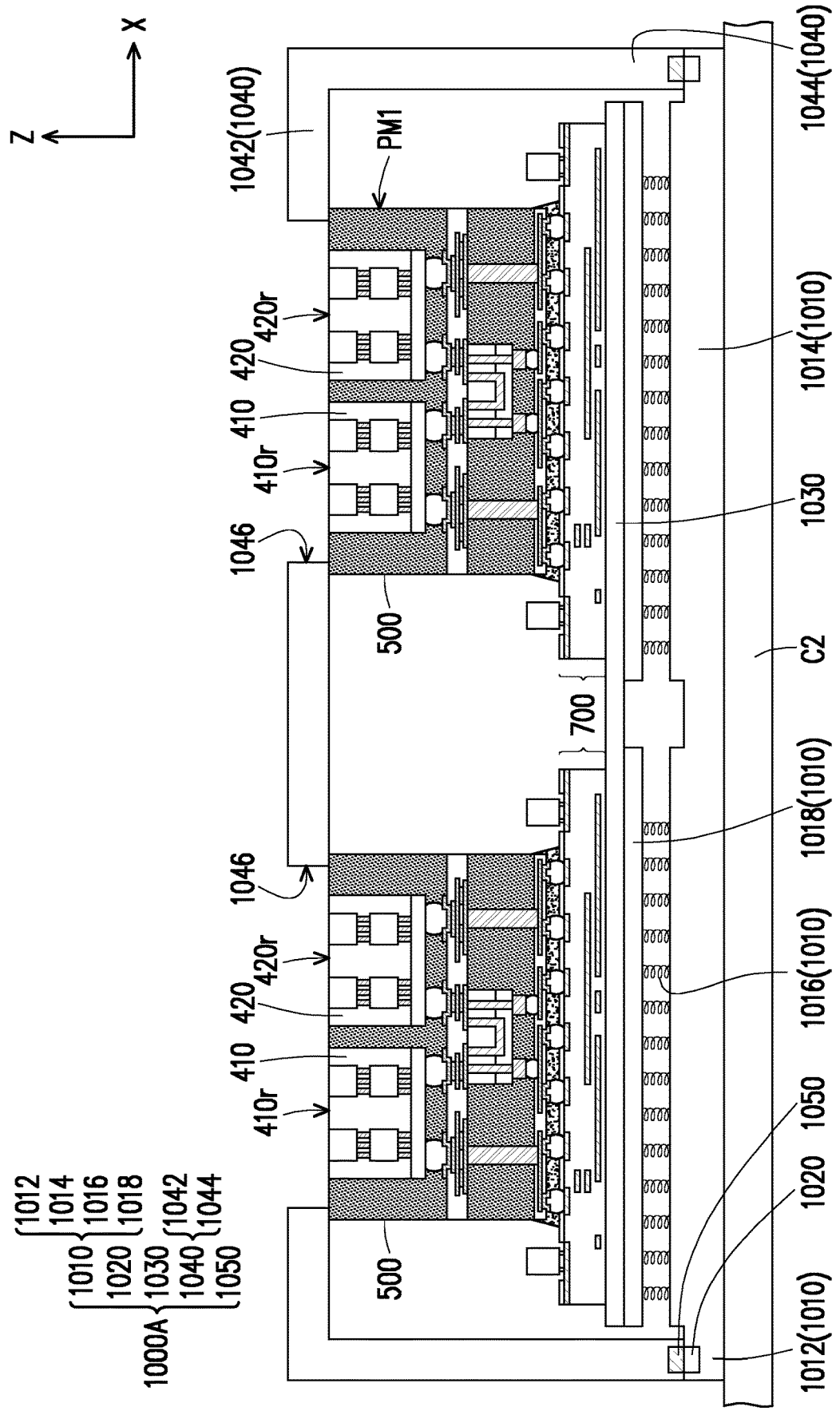
FIG. 11A to FIG. 11F are schematic cross-sectional views of structures formed during a manufacturing method of a semiconductor package according to some embodiments of the disclosure.

Referring to FIG. 1G, in some embodiments the packaged dies 10 may be connected to a circuit substrate 700 through the connective terminals 600. For example, the packaged dies 10 may be disposed on the circuit substrate 700 and a soldering step may be performed. In some embodiments, the circuit substrate 700 includes a core dielectric layer 710 having conductive traces 720 embedded therein. An upper solder mask 730 may be disposed on an upper side 700a of the circuit substrate 700, at the same side 700a where the packaged dies 10 are disposed. The solder mask 730 may extend on the core dielectric layer 710 and may include openings exposing outermost conductive traces 720. The connective terminals 600 of the packaged dies 10 may be disposed in the openings of the solder mask 730 to contact the conductive traces 720. In some embodiments, an underfill 800 may optionally be provided in between the packaged dies 10 and the circuit substrate 700. The underfill 800 may laterally wrap the connective terminals 600, for example, to protect the connective terminals 600 from mechanical stresses. In some embodiments, another solder mask 740 may be disposed on the core dielectric layer 710 at the bottom side 700b of the circuit substrate 700.

In some embodiments, passive devices 900 are provided on the upper side 700a of the circuit substrate 700, beside the packaged dies 10. In some embodiments, the passive devices 900 are placed over the circuit substrate 700 through a pick-and-place method. In some embodiments, the passive devices 900 are chips of integrated passive devices and function as capacitors, inductors, resistors, or the like. In some embodiments, each passive device 900 may independently function as a capacitor having different capacitance values, resonance frequencies, and/or different sizes, an inductor, or the like. In some embodiments, the passive devices 900 are disposed with the front surfaces directed towards the circuit substrate 700, so as to be connected with conductive traces 720 of the circuit substrate 700. In some embodiments, the packaged dies 10, the circuit substrate 700, the underfill 800, and the passive devices 900 may be collectively referred to as a package module PM1. Rear surfaces 410r, 420r of the semiconductor dies 410, 420 may be part of a top surface of the package module PM1. Even though only two passive devices 900 are presented in FIG. 1G within a package module PM1 for illustrative purposes, the disclosure is not limited by the number of passive devices 900 included in a package module PM1. Indeed, the disclosure does not limit the possible structures of the package module PM1. While the package module PM1 is illustrated in the drawings to present some aspects of the disclosure, package modules of different structure or fabricated with different manufacturing process than what was illustrated for the package module PM1 in FIG. 1A through FIG. 1G are contemplated within the scope of the disclosure.

Figure 1J:
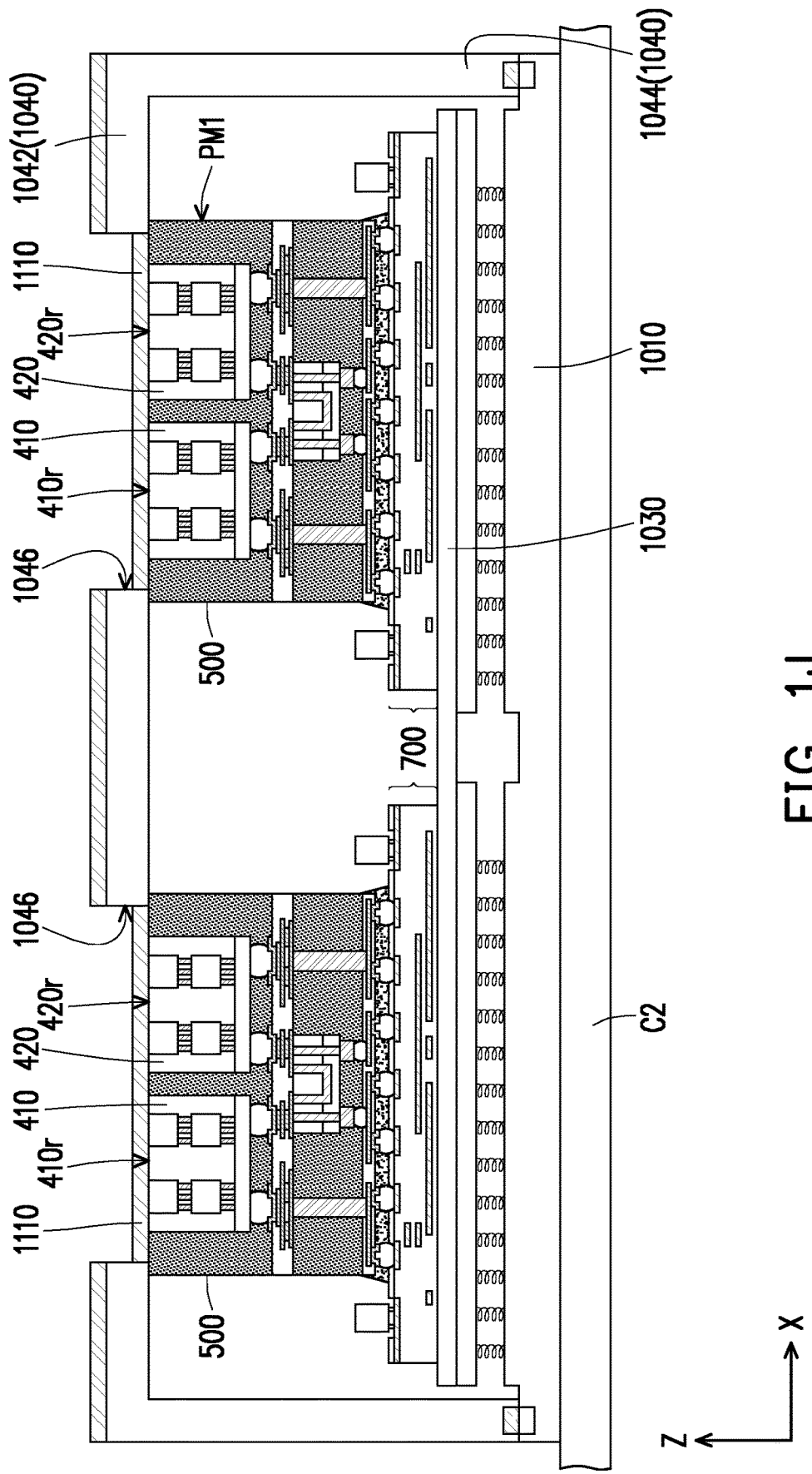
Figure 1K:
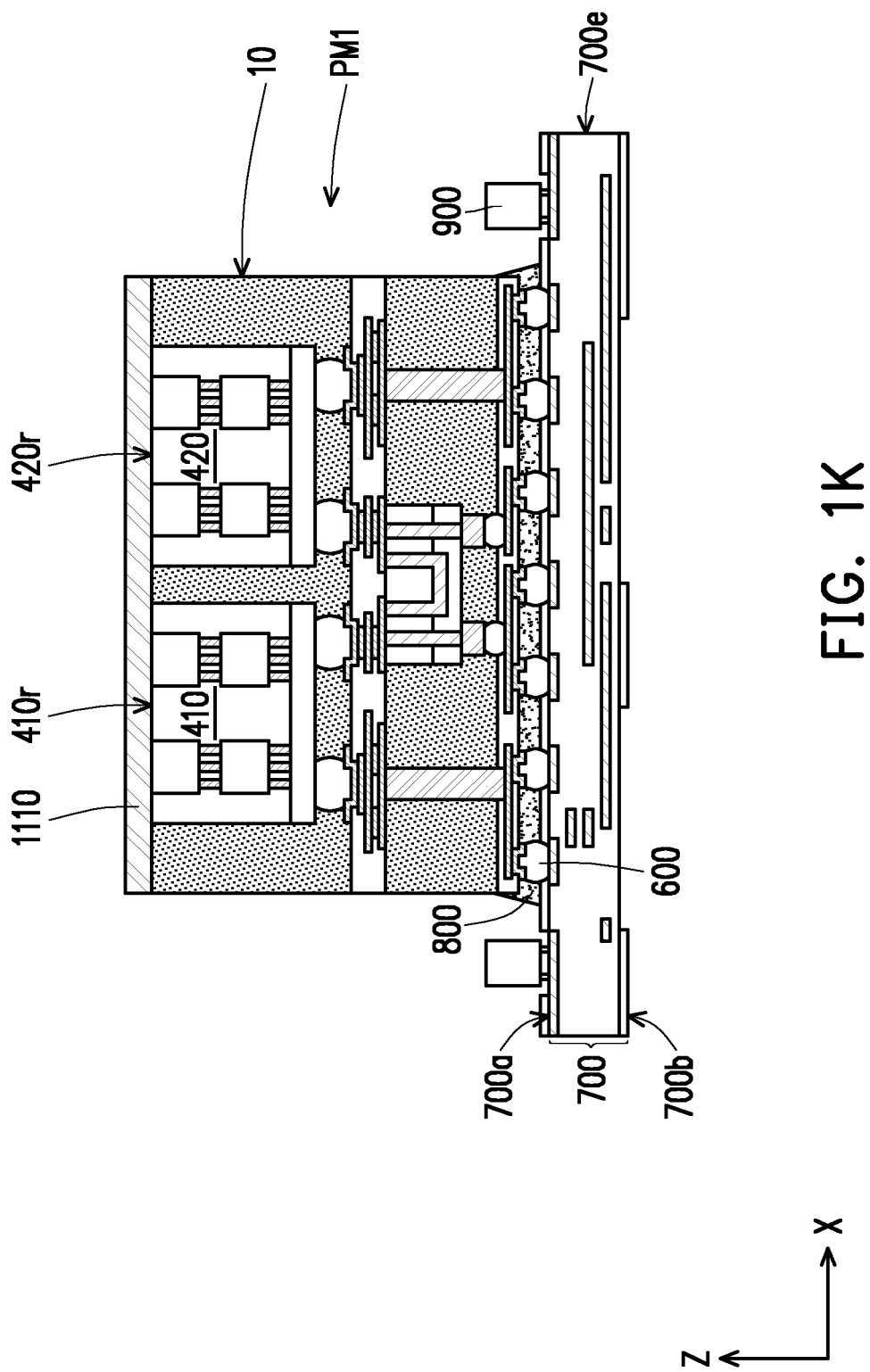
Figure 1L:
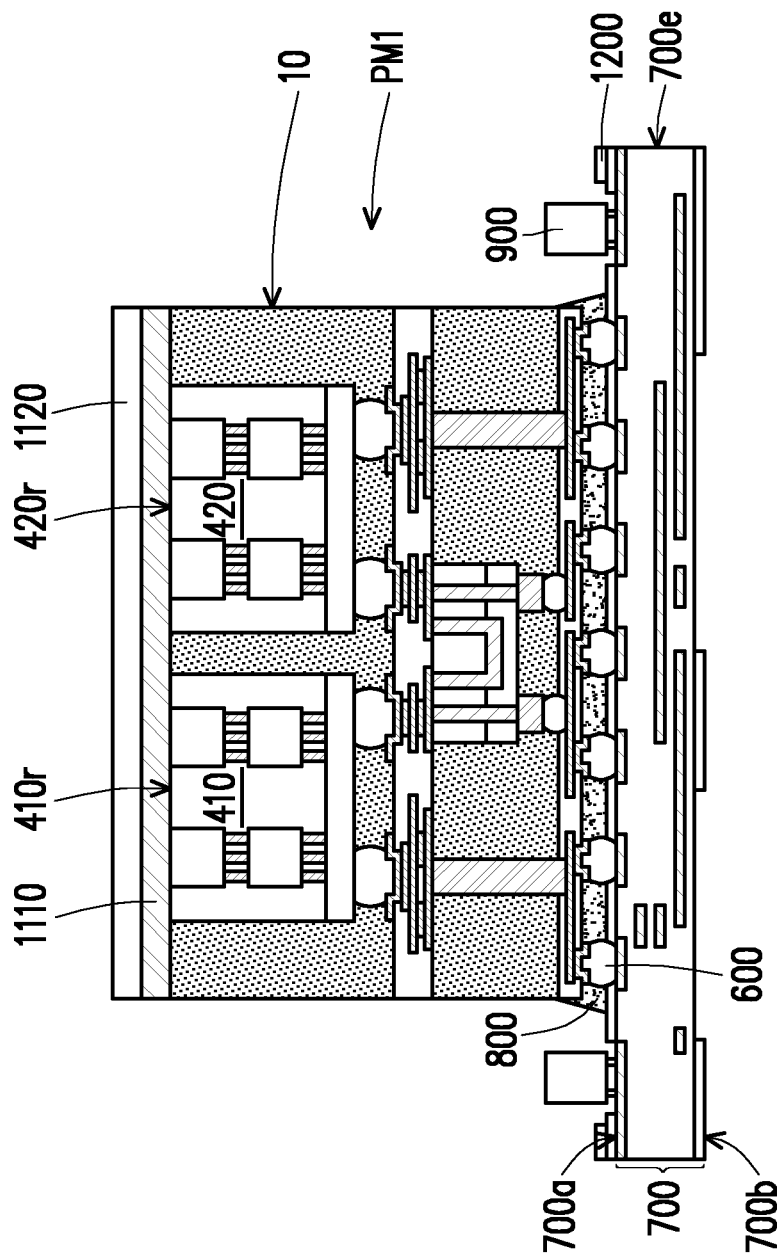
Figure 1M:
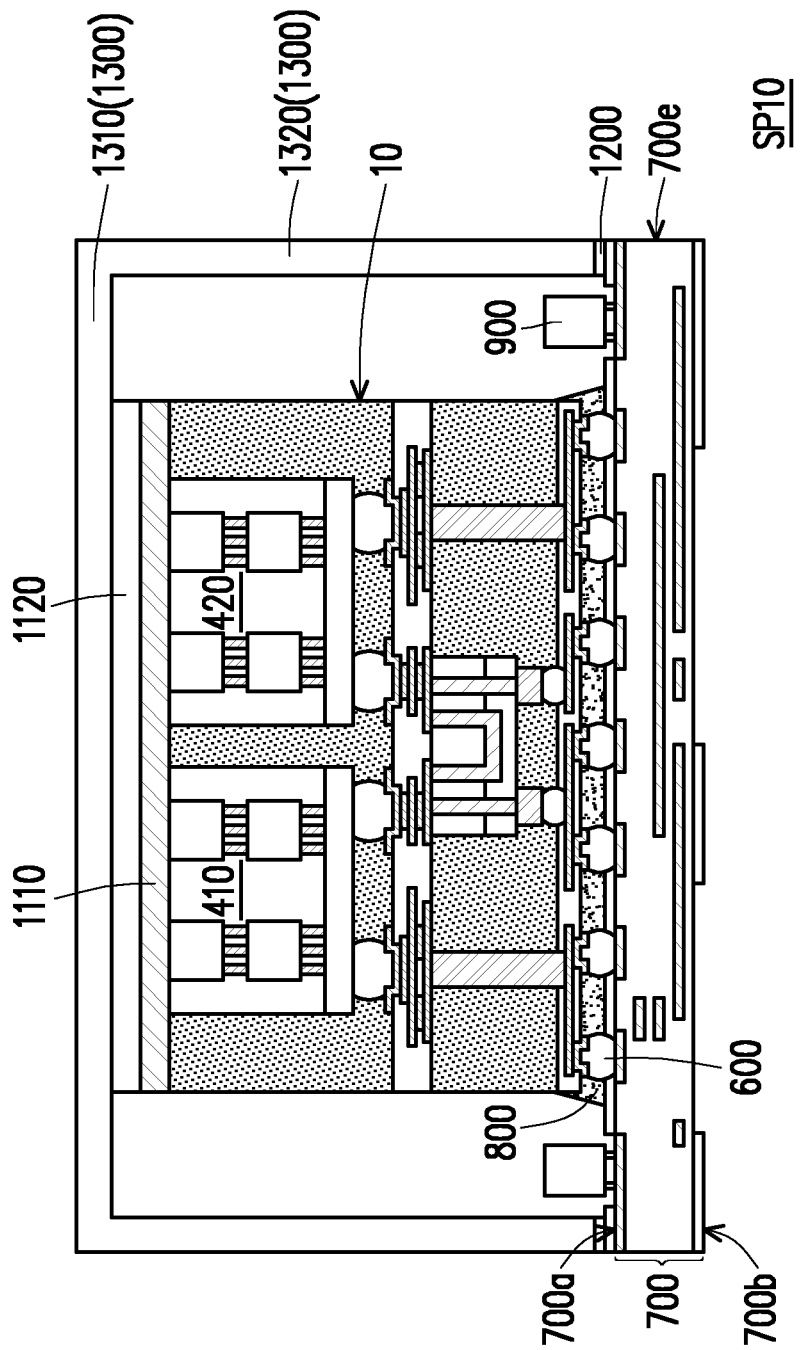
Figure 2A:
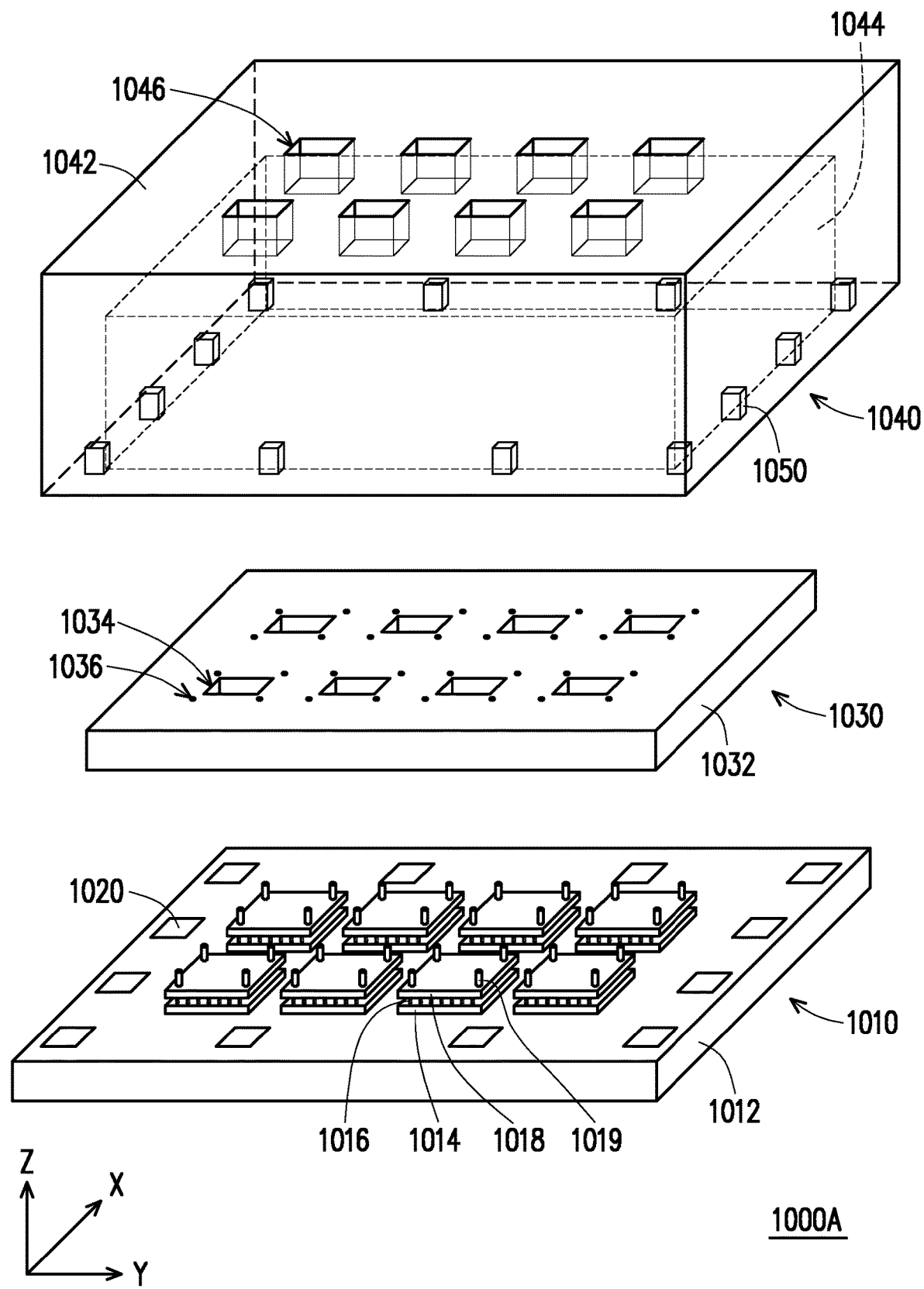
FIG. 2A to FIG. 2G are schematic perspective views of jigs for manufacturing semiconductor packages according to some embodiments of the disclosure.
Figure 3:
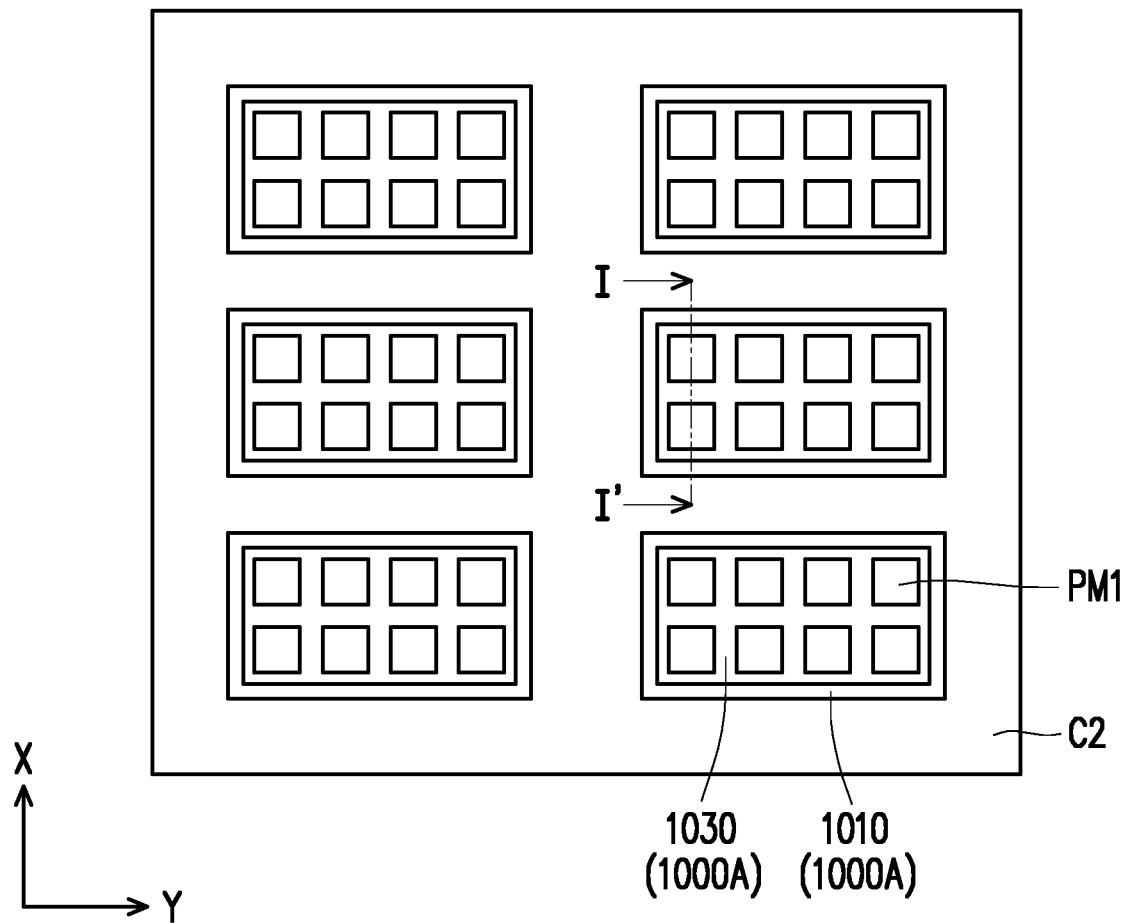
FIG. 3 is a schematic top view of jigs disposed on a carrier according to some embodiments of the disclosure.

FIG. 2A is a schematic perspective view of a jig 1000A for manufacturing of semiconductor packages according to some embodiments of the disclosure. FIG. 3 is a schematic top view of jigs 1000A disposed on a carrier C2 according to some embodiments of the disclosure. Referring to FIG. 1H, FIG. 2A, and FIG. 3, in some embodiments, one or more bottom pieces 1010 of jigs 1000A may be disposed on the carrier C2, for example in an array manner. It will be apparent that while six jigs 1000A are illustrated in FIG. 3, the disclosure is not limited by the number of jigs 1000A disposed on the carrier C2. In some embodiments, a jig 1000A includes a bottom piece 1010, a boat 1030, and an upper piece 1040. The bottom pieces 1010 of the jigs 1000A may be initially disposed on the carrier C2, and the corresponding boats 1030 may be disposed on the bottom pieces 1010. One or more package modules PM1 may be disposed on the bottom pieces 1010 of the jigs 1000A and may be kept in place by the boats 1030. In some embodiments, the package modules PM1 are disposed on the bottom piece 1010 of the jig 1000A with the circuit substrate 700 directed towards the bottom piece 1010 of the jig 1000A. For example, when the package modules PM1 are disposed on the jig 1000A, the circuit substrate 700 may extend through the boat 1030 to contact the bottom piece 1010 of the jig 1000A. While in FIG. 3 eight package modules PM1 are disposed on a jig 1000A, the number of package modules PM1 per jig 1000A is not limited. In some alternative embodiments, fewer or more package modules PM1 may be disposed on a same jig 1000A. In some embodiments, the cross-sectional views of FIG. 1H to FIG. 1M may be considered to be taken at a position corresponding to the line I-I' in FIG. 3.

In some embodiments, the bottom piece 1010 of a jig 1000A includes a base 1012 and may include one or more plateaus 1014 formed in a central region of the base 1012. In some embodiments, the plateaus 1014 are raised (along the Z direction) with respect to a top surface of the base 1012. In some embodiments, the base 1012 presents a peripheral region encircling the plateaus 1014. In some embodiments, the peripheral region of the base 1012 may be considered the annular region encircling the plateaus 1014 in proximity of the outer edge of the jig 1000A. In some embodiments, the flat regions of the base 1012 in between adjacent plateaus 1014 may also be considered part of the peripheral region of the base 1012. In some embodiments, springs 1016 may be disposed on each plateau 1014, to hold up a support plate 1018. In some embodiments, the number of springs 1016 disposed on a plateau 1014 is not particularly limited, and may be, for example, between 0 and 200. In some embodiments, a package module PM1 is disposed on the support plate 1018 over the springs 1016. In some embodiments, there may be as many plateaus 1014 with the corresponding support plates 1018 as the number of package modules PM1 to be disposed on the jig 1000A, so that each package module PM1 may have a dedicated plateau 1014 and support plate 1018. In some embodiments, magnets 1020 may be embedded in the base 1012. For example, the magnets 1020 may be entrenched in the annular peripheral region of the base 1012. In some embodiments, the magnets are disposed at regular intervals from each other along the edges of the base 1012. In some embodiments, one surface of the magnets 1020 is exposed in correspondence of the top surface of the base 1012. However, the magnets 1020 may be embedded in the base 1012 so that the top surface of the base 1012 may be substantially flat except for the plateaus 1014, even in the places where the magnets 1020 are exposed.

Figure 2B:
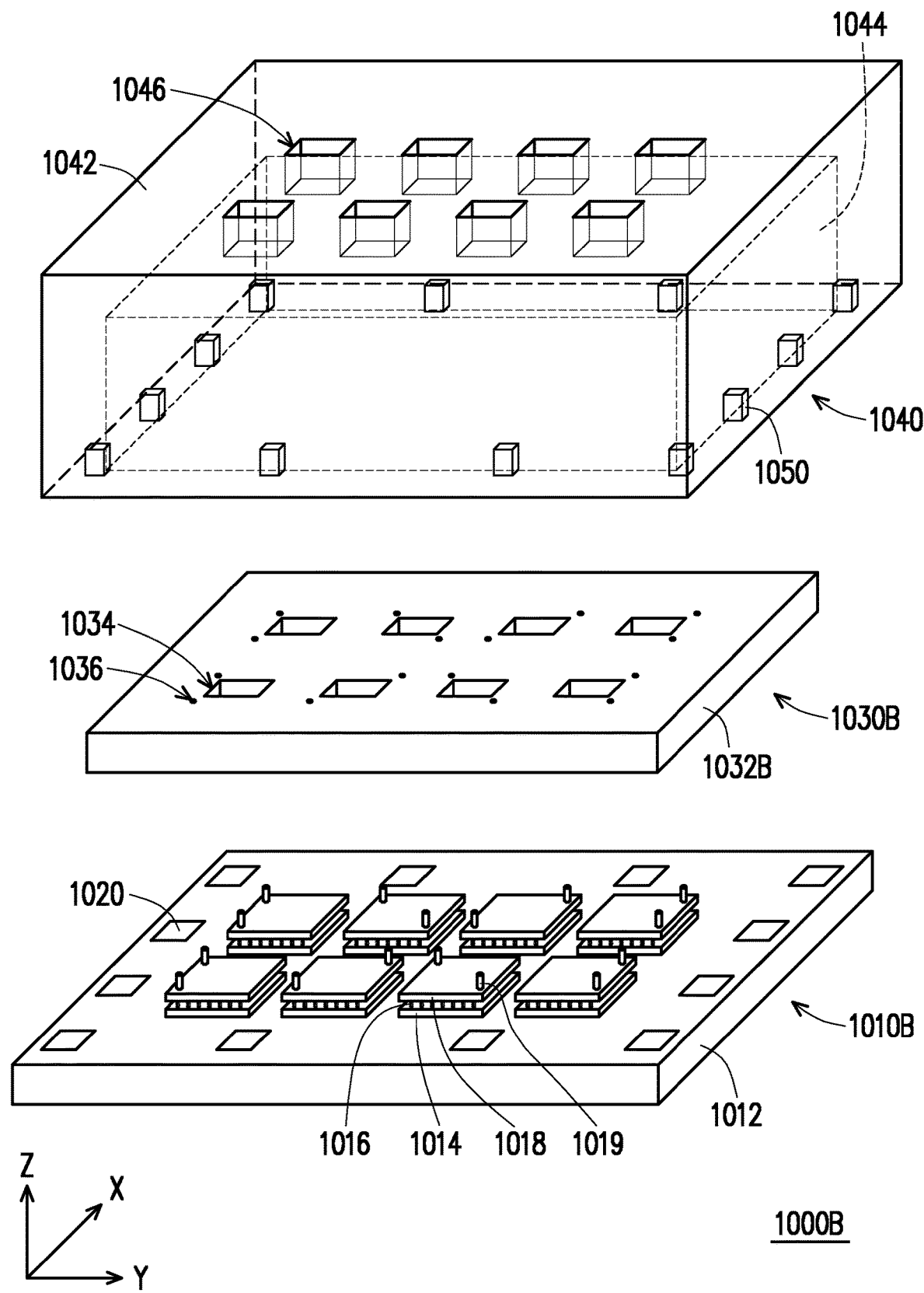
Figure 2C:
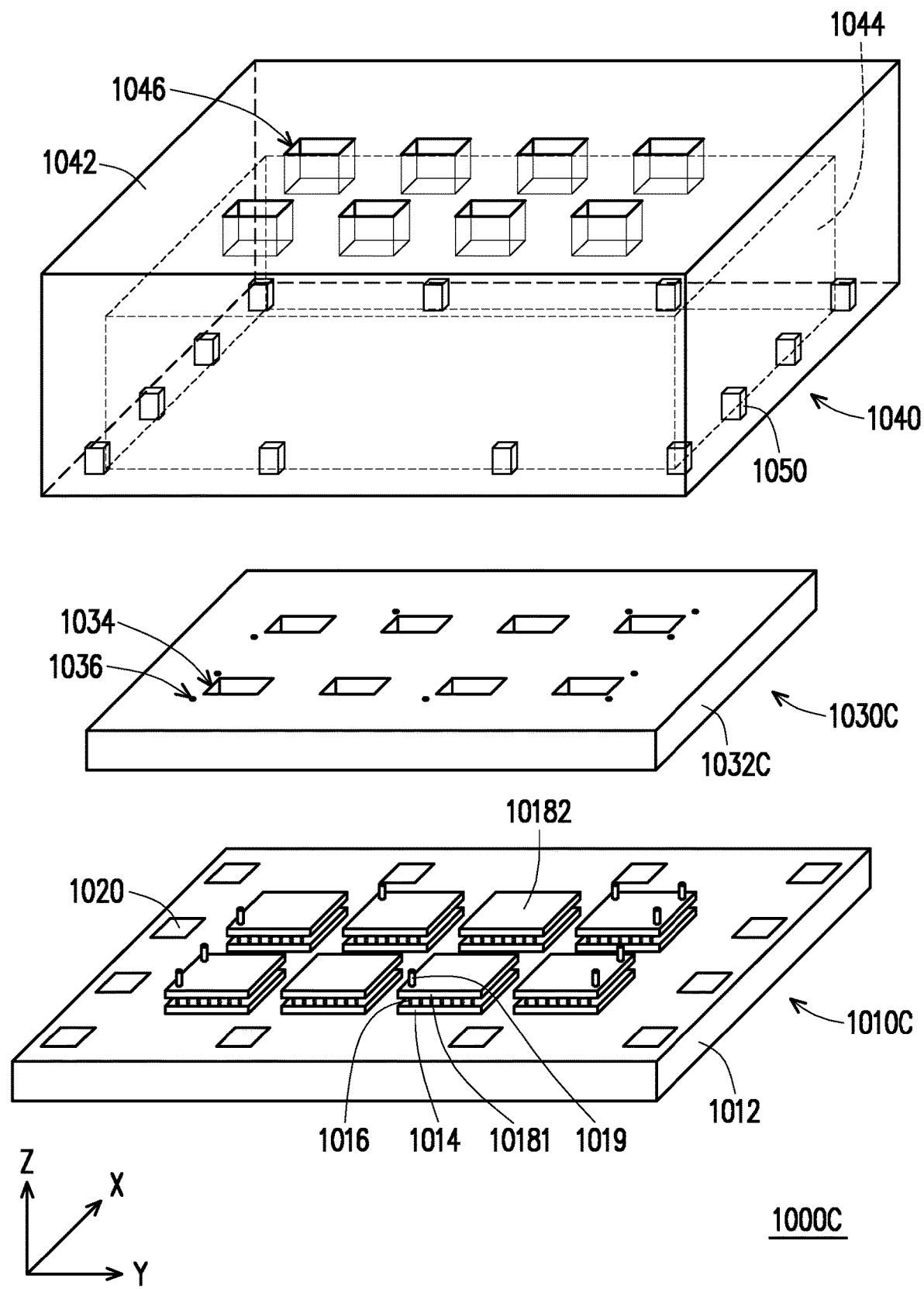
Figure 2D:
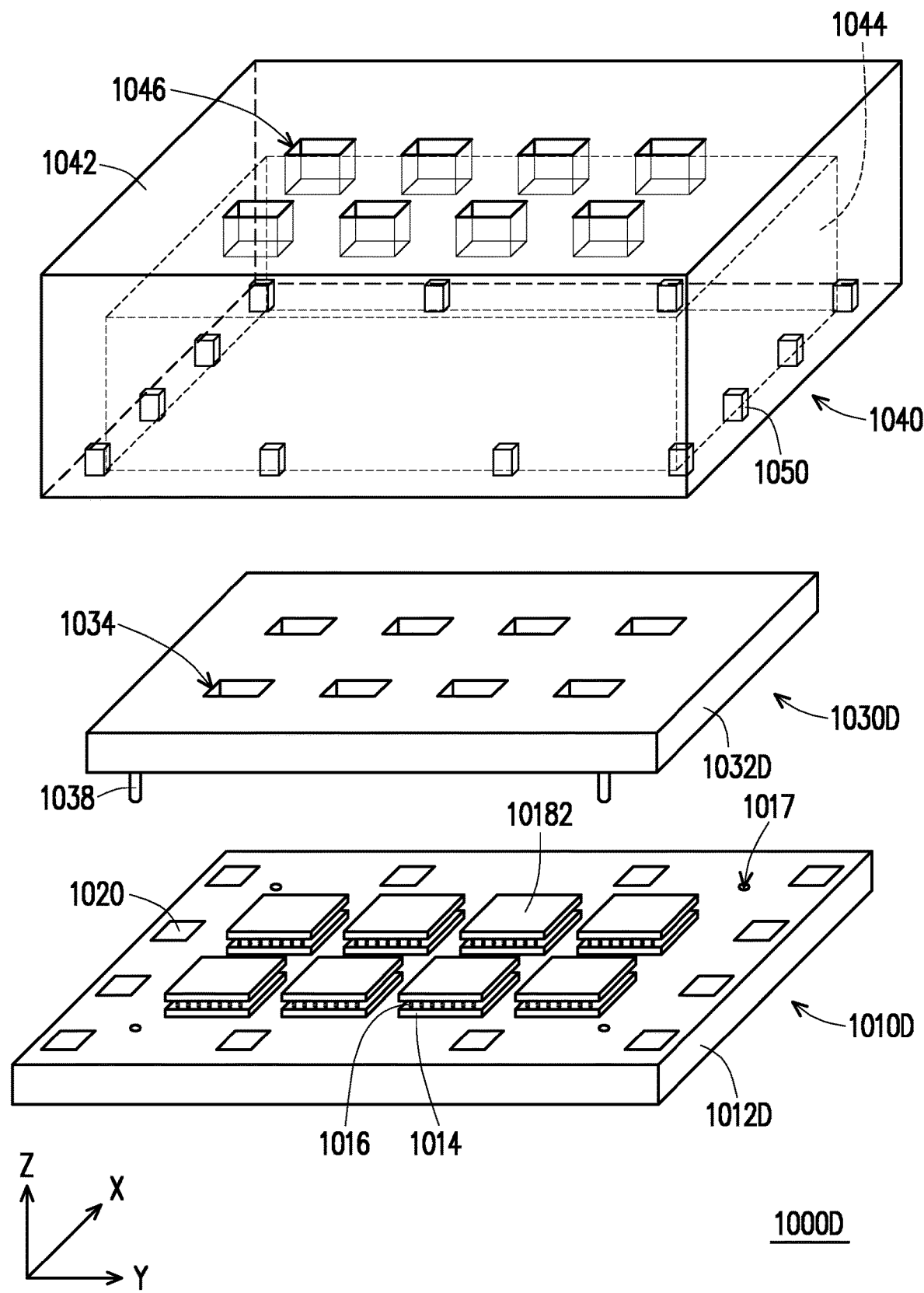

In some embodiments, the boat 1030 is disposed on the bottom piece 1010 before disposing the package modules PM1. The boat 1030 includes a body 1032 having one or more package openings 1034 formed therein. The body 1032 may be an integral block, for example a parallelepipedal block with a rectangular footprint. The package openings 1034 are through holes having a footprint substantially matching the footprint of the package modules PM1. The package openings 1034 may be slightly larger than the package modules PM1 so that the package modules PM1 may be accommodated within the package openings 1034 and be kept in place on the bottom piece 1010. In some embodiments, the boat 1030 of a jig 1000A may include as many package openings 1034 as there are plateaus 1014 and support plates 1018. For example, the boat 1030 illustrated in the drawings includes eight package openings 1034. In some embodiments, alignment mechanisms may be provided between the bottom piece 1010 and the boat 1030. For example, alignment pins 1019 may be formed on the support plates 1018, at one or more corners of the support plates 1018. Alignment holes 1036 may be formed in the body 1032, at a position selected so as to provide correct alignment between the bottom piece 1010 and the boat 1030 when the alignment pins 1019 are inserted in the alignment holes 1036. In FIG. 2A, the alignment holes 1036 are formed at the four corners of the package openings 1034, and the alignment pins 1019 are formed at the four corners of the support plates 1018. However, the disclosure is not limited thereto. In some alternative embodiments, fewer alignment pins 1019 (and corresponding alignment holes 1036) may be formed on the support plates 1018. For example, the alignment pins 1019 may be formed only at some of the corners of the support plates 1018 (e.g., at one, two, or three corners). As a way of example, in FIG. 2B is illustrated a perspective view of a jig 1000B according to some embodiments of the disclosure. The jig 1000B is similar to the jig 1000A of FIG. 2A. A difference between the jig 1000B and the jig 1000A of FIG. 2A may be that two alignment pins 1019 are formed on the support plates 1018. As illustrated in FIG. 2B, the alignment pins 1019 may be formed at different places of the support plates 1018. In some embodiments, the alignment pins 1019 may be disposed on the support plates 1018 following a symmetric scheme, so that the boat 1030B may be positioned on the bottom piece 1010B according to more than one orientation. For example, the pattern of the alignment pins 1019 and the alignment holes 1036 may be such that the boat 1030B could be rotated of 180 degrees around each one of the X, Y, or Z directions, and still be correctly inserted on the bottom piece 1010B. In some embodiments, by adopting configurations of higher symmetry, automated assembly of the jig 1000B may be simplified. In some alternative embodiments, the alignment pins 1019 may not be formed on all support plates 1018, but only on a few of them. For example, in the jig 1000C of FIG. 2C, the bottom piece 1010C includes support plates 10181 in which one or more alignment pins 1019 are formed (e.g., one, two, three, four, etc.), and support plates 10182 in which no alignment pins are formed. In some embodiments, the alignment pins 1019 may be formed in unsymmetrical or lower symmetry patterns. In some alternative embodiments, the alignment pins 1019 may not be formed on the support plates 1018 but directly on the base 1012. In some yet alternative embodiments, the alignment pins may be formed on the boat 1030D, and may be received in alignment holes 1017 (or alignment sleeves, not shown) formed in the base 1012D of the bottom piece 1010D, as illustrated for the jig 1000D of FIG. 2D. As illustrated by the above examples, the disclosure does not limit the position and number of the alignment pins and of the corresponding alignment holes.

In some embodiments, after the package modules PM1 are disposed on the jigs 1000A, the upper pieces 1040 of the jigs 1000A are placed on the corresponding bottom pieces 1010, as illustrated, e.g., in FIG. 1I. Referring to FIG. 1I and FIG. 2A, a footprint of an upper piece 1040 of a jig 1000A substantially matches the footprint of the corresponding base 1012. The upper piece 1040 is placed over the bottom piece 1010. In some embodiments, before placing the upper piece 1040, the upper piece 1040 is vertically aligned with the bottom piece 1010, matching the footprint of the upper piece 1040 with the footprint of the bottom piece 1010. In some embodiments, the upper piece 1040 includes a cap 1042 and outer flanges 1044. The outer flanges 1044 may be disposed at the periphery of the cap 1042. That is, the outer flanges 1044 may be located at the edge of the cap 1042, and project towards the basis 1012. In some embodiments, the cap 1042 overlies the support plates 1018 and the package modules PM1 disposed thereon. In some embodiments, if the outer flanges 1044 extend from the cap 1042 to the base 1012 along a vertical direction (e.g., the Z direction), the cap 1042 may be considered to extend along the orthogonal X and Y directions to cover the footprint of the base 1012. In some embodiments, the outer flanges 1044 and the cap 1042 are integrally formed. That is, the outer flanges 1044 and the cap 1042 may be formed as a single piece, jointed to each other without a clear interface between the two.

Figure 2E:
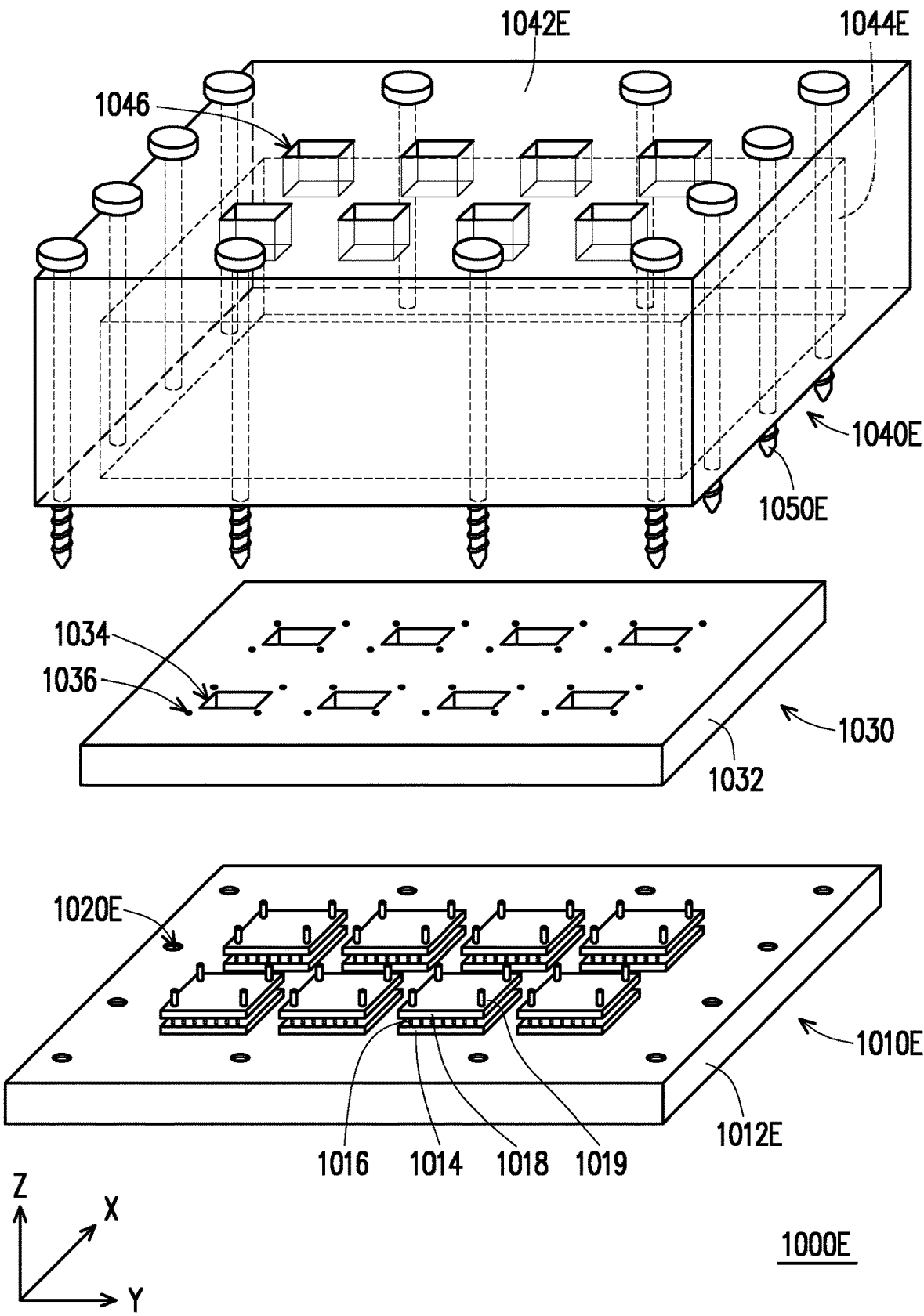

In some embodiments, the outer flanges 1044 reach the base 1012 where the magnets 1020 are disposed. In some embodiments, the outer flanges 1044 contact the base 1012 in correspondence of the annular peripheral region of the base 1012. In some embodiments, magnets 1050 are embedded in the outer flanges 1044, in positions corresponding to the magnets 1020. In some embodiments, the magnets 1020 and the magnets 1050 may be polarized so as to be reciprocally attracted. In some embodiments, the upper piece 1040 of the jig 1000A may be secured to the bottom piece 1010 by the attractive forces generated by the magnets 1020, 1050. In some embodiments, a magnet 1020 may have different polarization with respect to adjacent magnets 1020. For example, given three magnets 1020 disposed consecutively in a row, the central magnet 1020 may have an opposite polarization with respect to the other two magnets 1020. In the upper piece 1040, the corresponding three magnets 1050 may also be polarized so that the central magnet 1050 is attracted to the central magnet 1020, while the other two magnets 1050 are attracted to the other two magnets 1020. In some embodiments, polarization patterns of the magnets 1020, 1050 may be adopted so that the magnets 1020, 1050 hold the upper piece 1040 and the bottom piece 1010 of the jig 1000A together and also ensure correct alignment between the upper piece 1040 and the bottom piece 1010. However, the disclosure is not limited thereto. In some alternative embodiments, the magnets 1020, 1050 may be omitted, and the upper piece 1040 and the bottom piece 1010 may be held together through other fasteners, for example, mechanical fasteners such as screws or clamps. For example, in the jig 1000E illustrated in FIG. 2E, the base 1012E of the bottom piece 1010E includes threaded holes 1020E formed in the annular peripheral region. Screws 1050E extend from over the cap 1042E through the outer flanges 1044E of the upper piece 1040E to be received in the threaded holes 1020E. Other aspects of the jig 1000E may be similar to what was previously described for the jig 1000A of FIG. 2A.

Figure 2F:
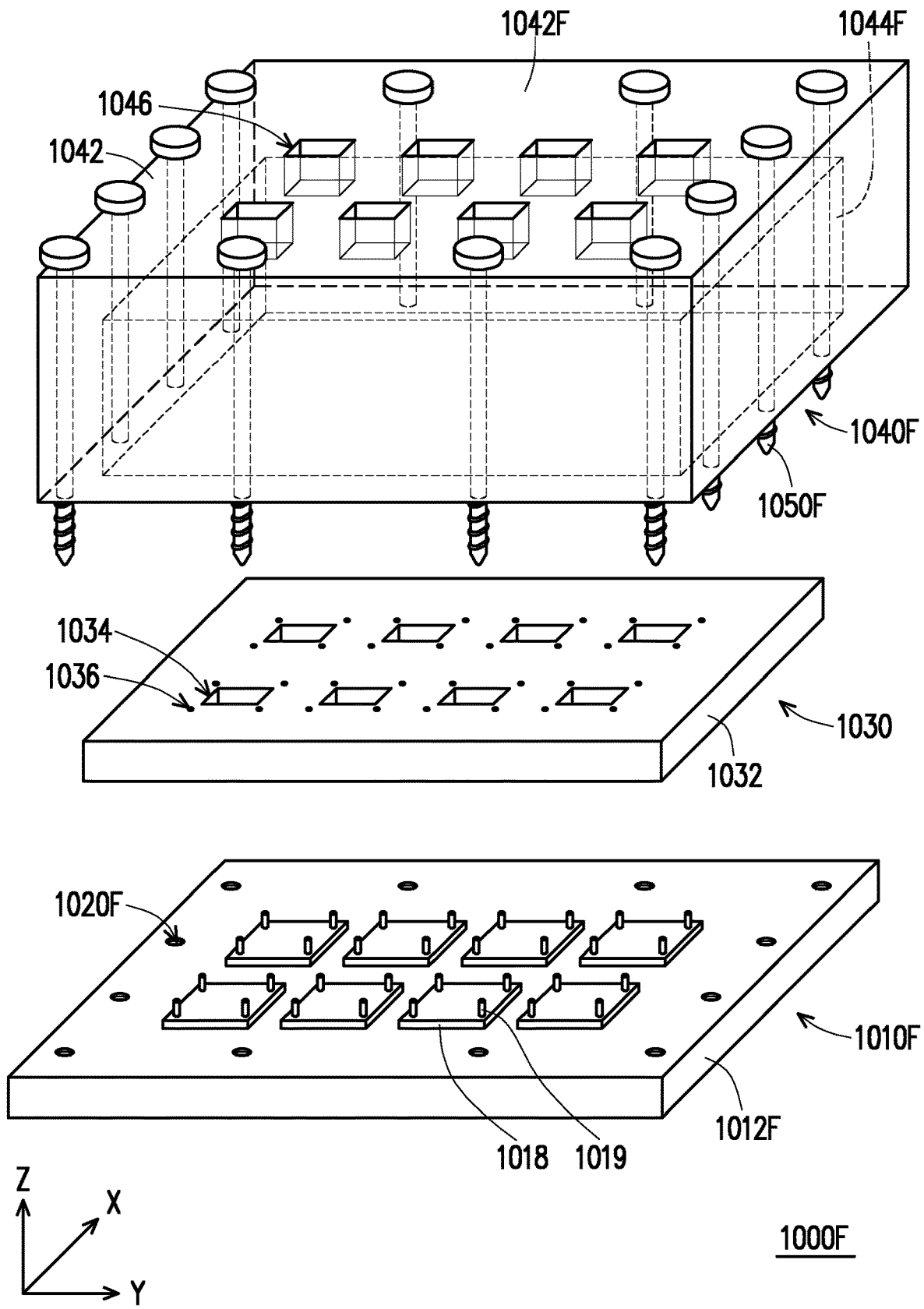
Figure 2G:
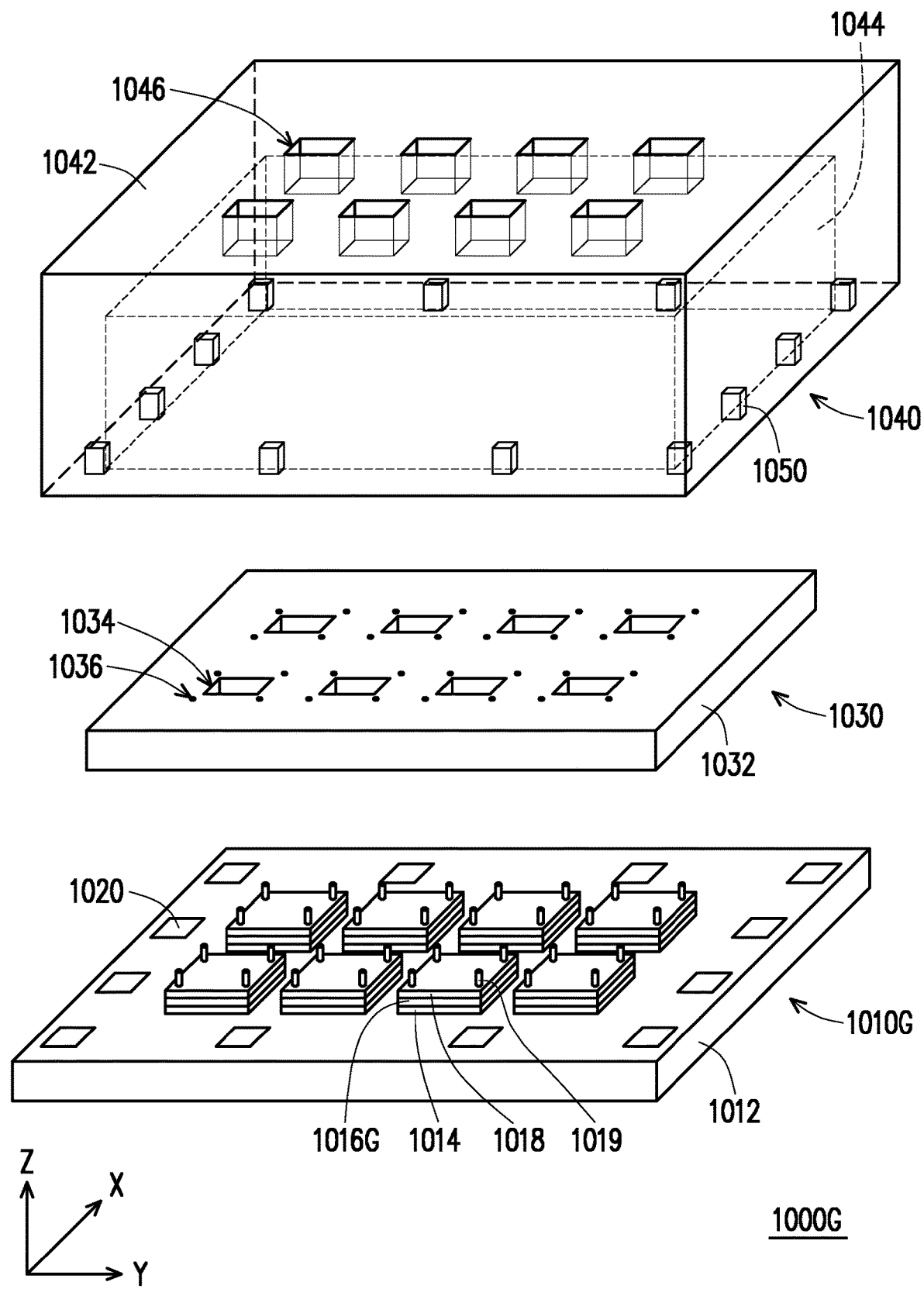

In some embodiments, the outer flanges 1044 extend towards the base 1012 and encircle the plateaus 1014 and the package modules PM1 disposed on the base 1012. In some embodiments, the outer flanges 1044, the cap 1042, and the base 1012 define a hollow space in which the package modules PM1 are accommodated. That is, the package modules PM1 may be contained within the jig 1000A. In some embodiments, openings 1046 are formed through the cap 1042 so that the top surfaces of the package modules PM1 are at least partially exposed by the jig 1000A. For example, the rear surfaces 410r, 420r of the semiconductor dies 410, 420 are revealed by the openings 1046. In some embodiments, the openings 1046 may be formed in the cap 1042 so that the cap 1042 still contacts the package modules PM1 along the edges of the openings 1046. In some embodiments, the area in the XY plane of an opening 1046 is smaller than the spans of the underlying package module PM1 and support plate 1018. In some embodiments, a vertical projection of the area of the opening 1046 may fall entirely on the underlying support plate 1018. In some embodiments, the vertical projection of the area of the opening 1046 may fall entirely on the portion of the underlying support plate 1018 revealed by the package opening 1034. In some embodiments, by action of the springs 1016, the package modules PM1 may be pushed against the cap 1042, so that the package modules PM1 seals the bottoms of the openings 1046. For example, the encapsulant 500 may contact and be pushed against the cap 1042 at the edge of the openings 1046. However, the disclosure is not limited thereto. For example, in package modules (not shown) in which the rear surface of the package module substantially coincides with the rear surface of a chip (e.g., corresponds to a rear surface of a semiconductor substrate), the edges of the rear surface of the chip may contact the cap 1042 around the openings 1046, and the remaining part of the rear surface of the chip may be exposed by the opening 1046. In some embodiments, the height of the outer flanges 1044 along the Z direction may be selected so that the package modules PM1 seals the openings 1046. In some embodiments, the springs 1016 may be omitted, and the compression force on the package modules PM1 may be generated by the relative heights of the package module PM1 and the outer flanges 1044. For example, in the jig 1000F illustrated in FIG. 2F, the support plates 1018 are formed directly on the base 1012F, without springs or plateaus as in the jig 1000A of FIG. 2A. The compressive force on the package modules may be regulated by selecting the height of the outer flanges 1040F. In some embodiments, the upper piece 1040F and the bottom piece 1010F may be joined by screws 1050F received in the threaded holes 1020F formed in the base 1012F, to further tune the compressive force generated by the jig 1000F. However, the disclosure is not limited thereto, and, in some alternative embodiments, other fasteners (e.g., the magnets as in the jig 1000A of FIG. 2A, clamps, etc.) may be employed. In some yet alternative embodiments, other elastic elements than springs may be included to push the package modules PM1 against the upper piece 1040. For example, an elastic pad 1016G such as a rubber pad may be disposed between the plateau 1014 and the support plate 1018, as illustrated for the bottom piece 1010G of the jig 1000G of FIG. 2G. The elastic properties of the elastic pad 1016G may be selected so that adequate pushing force acts on the package modules PM1. In some embodiments, there are as many openings 1046 as the number of package modules PM1 enclosed in the jig 1000A, one opening 1046 per package module PM1.

In some embodiments, the bottom piece 1010, the boat 1030, and the upper piece 1040 of the jig 1000A may be independently formed of any suitable material. For example, the materials for the bottom piece 1010, the boat 1030, and the upper piece 1040 may independently include stainless steel, iron, copper, titanium, other metals, ceramic materials, or any material capable of withstanding the subsequent steps of the manufacturing process. In some embodiments, the jig 1000A may be subjected to an anodization or passivation treatment (e.g., with nickel) to enhance its environmental resistance and reduce interferences in subsequent manufacturing steps.

In some embodiments, a backside metallization layer 1110 is formed on the portions of the top surfaces of the package modules PM1 exposed by the openings 1046, as illustrated in FIG. 1J. In some embodiments, the backside metallization layer 1110 may include a thermally conductive material, for example cobalt (Co), tungsten (W), copper (Cu), titanium (Ti), tantalum (Ta), aluminum (Al), zirconium (Zr), hafnium (Hf), nickel (Ni), silver (Ag), gold (Au), zinc (Zn), NiV, a combination thereof, or other suitable metallic materials. In some embodiments, the backside metallization layer 1110 is formed by suitable deposition processes, such as sputtering or evaporation. In some embodiments, because the package modules PM1 are pressed against the cap 1042 to seal the openings 1046 (for example, by action of the springs 1016), the material of the backside metallization layer 1110 may be selectively formed on the top surfaces of the package modules PM1, without seeping in and be deposited in other regions of the package modules PM1 (e.g., on the circuit substrates 700). That is, the upper piece 1040 including the openings 1046 may act as a deposition mask during formation of the backside metallization layer 1110, protecting regions of the package modules PM1 where the backside metallization layer 1110 is not needed. In some embodiments, the material of the backside metallization layer 1110 may be initially deposited on the upper piece 1040 of the jig 1000A as well as within the openings 1046. Referring to FIG. 1J and FIG. 1K, in some embodiments, the package modules PM1 may be recovered from the jig 1000A. For example, the jig 1000A may be opened by removing the upper piece 1040, and the package modules PM1 may be picked from the open jigs 1000A. In some embodiments, the package modules PM1 may be simply placed on the bottom pieces 1010 of the jigs 1000A without additional adhesives, being kept in place by the boats 1030. In such embodiments, the package modules PM1 having the backside metallization layers 1110 formed thereon may be conveniently recovered from the jigs 1000A without needing additional processes to treat adhesive materials, removing protecting glues, or the like. In some embodiments, the package modules PM1 may be recovered from the jigs 1000A after formation of the backside metallization layer 1110. The jig 1000A may then be cleaned to remove the material of the backside metallization layer 1110 formed on the upper piece 1040, so as to be reused to manufacture other package modules PM1.

Referring to FIG. 1L, in some embodiments, a thermal interface material (TIM) 1120 may then be disposed on the backside metallization layer 1110, as illustrated, e.g., in FIG. 1K. In some embodiments, the TIM 1120 is an adhesive material. In some embodiments, the TIM 1120 includes grease-based materials, phase change materials, gels, adhesives, polymeric, metallic materials, or a combination thereof. In some embodiments, the TIM 1120 includes lead-tin based solder (PbSn), lead-free solder, silver paste (Ag), gold, tin, gallium, indium, carbon composite materials, graphite, carbon nanotubes, or other suitable thermally conductive materials. In some embodiments, the TIM 1120 is a gel type material. According to the type of material used, the TIM 1120 may be formed by deposition, lamination, printing, plating, or any other suitable technique. For example, gel-type materials may be dispensed on the package modules PM1. In some alternative embodiments, the TIM 1120 may be a film type material. For example, the TIM 1120 may be a sheet of conductive material (e.g., carbon nanotubes, graphene, or graphite) or a composite film with conductive materials such as fillers (e.g., powders, flake shape particles, nanotubes, fibers, etc.) embedded in a base material.

In some embodiments, an adhesive 1200 is disposed on the upper side 700*a* of the circuit substrate 700, in proximity of the outer edge 700*e* of the circuit substrate 100. In some embodiments, the outer edge 700*e* of the circuit substrate 700 is the peripheral surface connecting the upper side 700*a* to the opposite bottom side 700*b*. In some embodiments, the adhesive 1200 forms a frame following the profile of the outer edge 700*e* of the circuit substrate 700. For example, if the circuit substrate 700 has a rectangular footprint, the adhesive 1200 may have the shape of a rectangular frame. Similarly, if the circuit substrate 700 has a circular footprint, the adhesive 1200 may have the shape of a circular frame. In some embodiments, multiple portions of adhesive 1200 are disposed on the circuit substrate 700. That is, the frame formed by the adhesive 1200 may be discontinuous, presenting gaps in which the circuit substrate 700 is exposed in between consecutive portions of adhesive 1200. The packaged dies 10 and the passive devices 900 are disposed within the frame formed by the adhesive 1200. In some embodiments, the adhesive 1200 includes a thermocurable adhesive, a photocurable adhesive, a thermally conductive adhesive, a thermosetting resin, a waterproof adhesive, a lamination adhesive, or a combination thereof. In some embodiments, the adhesive 1200 includes a thermally conductive adhesive. In some embodiments, the adhesive 1200 includes a metallic layer (not shown) with solder paste (not shown) deposited thereon. According to the type of material used, the adhesive 1200 may be formed by deposition, lamination, printing, plating, or any other suitable technique.

FIG. 1M is a cross-sectional view of the semiconductor package SP10 according to some embodiments of the disclosure. In some embodiments, manufacturing the semiconductor package SP10 includes disposing a metallic cover 1300 on the circuit substrate 700, for example on the structure illustrated in FIG. 1L. In some embodiments, the metallic cover 1300 may be made of a conductive material. For example, the metallic cover 1300 may include a metallic material, such as copper. In some embodiments, the metallic cover 1300 may be subjected to an anodization or passivation treatment (e.g., with nickel) to enhance its environmental resistance before it is installed on the circuit substrate 700. In some embodiments, a footprint of the metallic cover 1300 substantially matches the footprint of the circuit substrate 700. In some embodiments, the metallic cover 1300 includes a lid 1310 and flanges 1320. The metallic cover 1300 is placed over the circuit substrate 700. In some embodiments, before placing the metallic cover 1300, the metallic cover 1300 is vertically aligned with the circuit substrate 700 and the footprint of the metallic cover 1300 matches with the footprint of the circuit substrate 700. The flanges 1320 may be disposed at the periphery of the lid 1310. That is, the flanges 1320 may be located at the edge of the lid 1310, and project towards the circuit substrate 700. In some embodiments, the lid 1310 is disposed over the circuit substrate 100 and the semiconductor package 200. In some embodiments, if the flanges 1320 extend from the lid 1310 to the circuit substrate 700 along a vertical direction (e.g., the Z direction), the lid 1310 may be considered to extend along the X and Y directions to cover the footprint of the circuit substrate 700. In some embodiments, the flanges 1320 and the lid 1310 are integrally formed. That is, the flanges 1320 and the lid 1310 may be formed as a single piece, jointed to each other without a clear interface between the two. In some embodiments, the flanges 1320 extend towards the circuit substrate 700 and encircle the packaged dies 10 and the passive devices 900. In some embodiments, the flanges 1320 reach the circuit substrate 700 where the adhesive 1200 is disposed. The adhesive 1200 may secure the flanges 1320 to the circuit substrate 700. In some embodiments, the adhesive 1200 is disposed on the circuit substrate 700 only where the flanges 1320 are expected to contact the circuit substrate 700. In some embodiments, the backside metallization layer 1110, the TIM 1120 and the metallic cover 1300 may promote dissipation of heat generated during usage of the semiconductor package SP10.

As illustrated by the above disclosure, in some embodiments the packaged dies 10 may be initially processed in the form of a reconstructed wafer, and the backside metallization layer 1110 may be formed after the packaged dies 10 are singulated from the reconstructed wafer and connected to the circuit substrate 700 to form package modules PM1 (as illustrated, e.g., in FIG. 1G). Because the backside metallization layer 1110 is not yet formed when the packaged dies 10 are singulated or connected to the circuit substrate 700, the material for the backside metallization layer 1110 may be chosen with fewer concerns as to the material behavior during sawing or reflow processes. Therefore, the material of the backside metallization layer 1110 may be selected from a wider range of candidates, for example with greater consideration as to the heat dissipation properties of the material. In some embodiments, the package modules PM1 may be placed in a jig 1000A (illustrated, e.g., in FIG. 2A) for semiconductor manufacturing, which may be used as a deposition mask during formation of the backside metallization layer 1110. By doing so, the jig 1000A may protect the surfaces of the package modules PM1 on which deposition of the backside metallization layer 1110 is not needed or not desired. In some embodiments, the bottom piece 1010 and the upper piece 1040 of the jig 1000A may be held together by action of paired magnets 1020, 1050 (or other mechanical fasteners), so that assembly and disassembly of the jig 1000A may be effected without additional curing, treating or washing steps. Therefore, the manufacturing process of the semiconductor package SP10 may be simplified, increasing the process yield and reducing the manufacturing costs.

Figure 4:
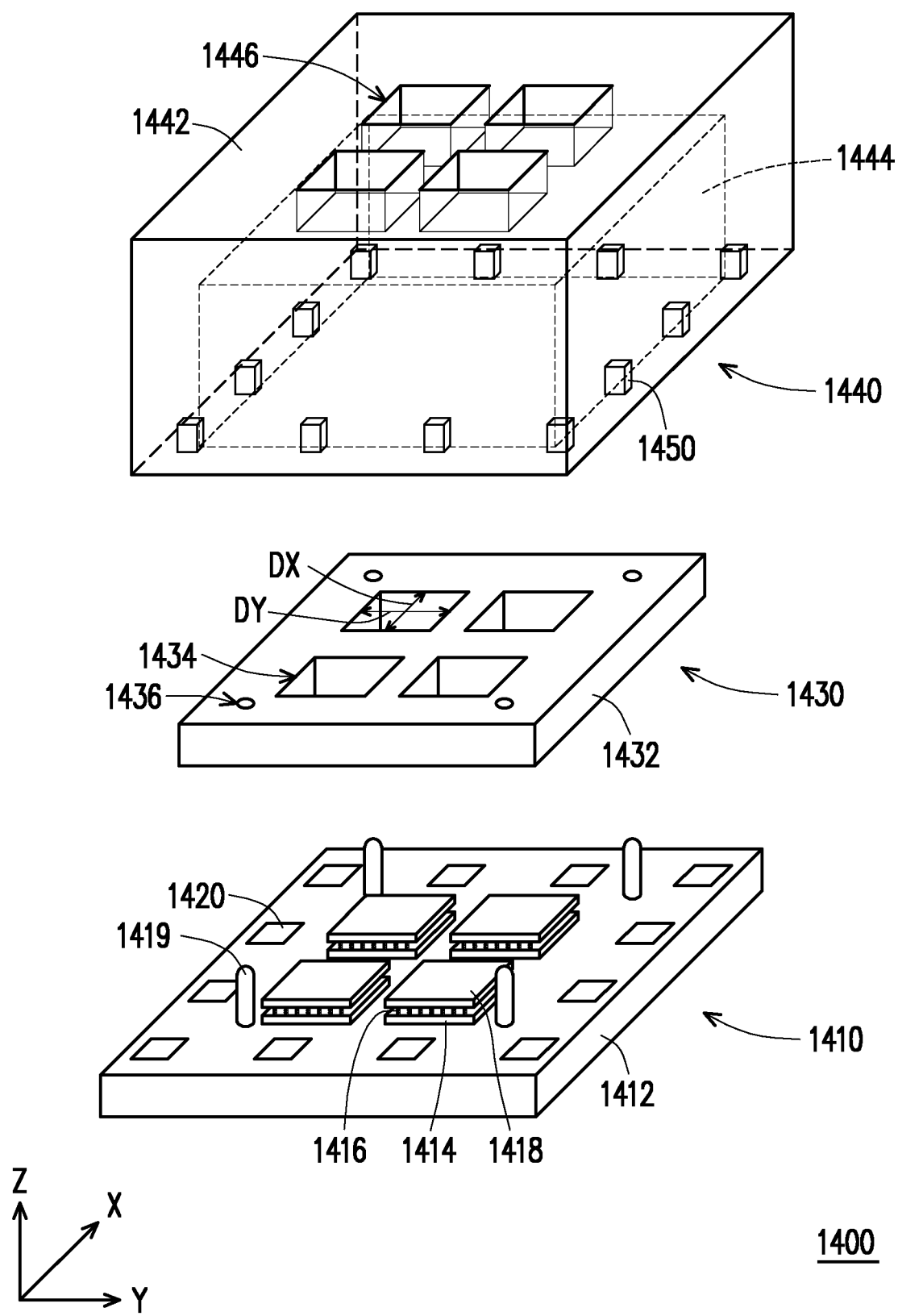
FIG. 4 is a schematic perspective view of a jig for manufacturing semiconductor packages according to some embodiments of the disclosure.

FIG. 4 is a schematic perspective view of a jig 1400 for manufacturing semiconductor packages according to some embodiments of the disclosure. The jig 1400 has a similar structure to the jig 1000A of FIG. 2A. A difference between the jig 1000A of FIG. 2A and the jig 1400 of FIG. 4 is that the jig 1400 of FIG. 4 is adapted to manufacture larger semiconductor packages (e.g., semiconductor packages having a larger footprint). Therefore, even though the bottom pieces 1410, 1010 of the jigs 1400 and 1000A have substantially the same footprint (occupy the same space in the XY plane), fewer (e.g., four, rather than 8) but larger plateaus 1414 are formed on the base 1412 of the jig 1400. Similarly, the boat 1430 has fewer package openings 1434 formed in the body 1432, but the size of the package openings 1434 (e.g., the sizes DX and DY along the X and Y direction) may be larger than the corresponding sizes of the package openings 1034 of FIG. 2A. Similarly, the upper piece 1440 includes fewer but larger openings 1446 formed in the cap 1442. Another difference between the jig 1400 and the jig 1000A of FIG. 2A lies in the alignment pins 1419 being formed on the base 1412, rather than on the support plates 1418. For example, the alignment pins 1419 are located at the four inner corners of the annular peripheral region of the base 1412. Consequently, four alignment holes 1436 are formed in the body 1432 of the boat 1430. Other aspects of the two jigs 1000A, 1400 may be the same as previously described. For example, arrays of springs 1416 are disposed between the plateaus 1414 and the support plates 1418 and magnets 1420 are embedded in the base 1412, for example in the annular peripheral region, to hold together the upper piece 1440 and the bottom piece 1410 by interaction with the magnets 1450 embedded in the outer flanges 1444 of the upper piece 1440.

Figure 5:
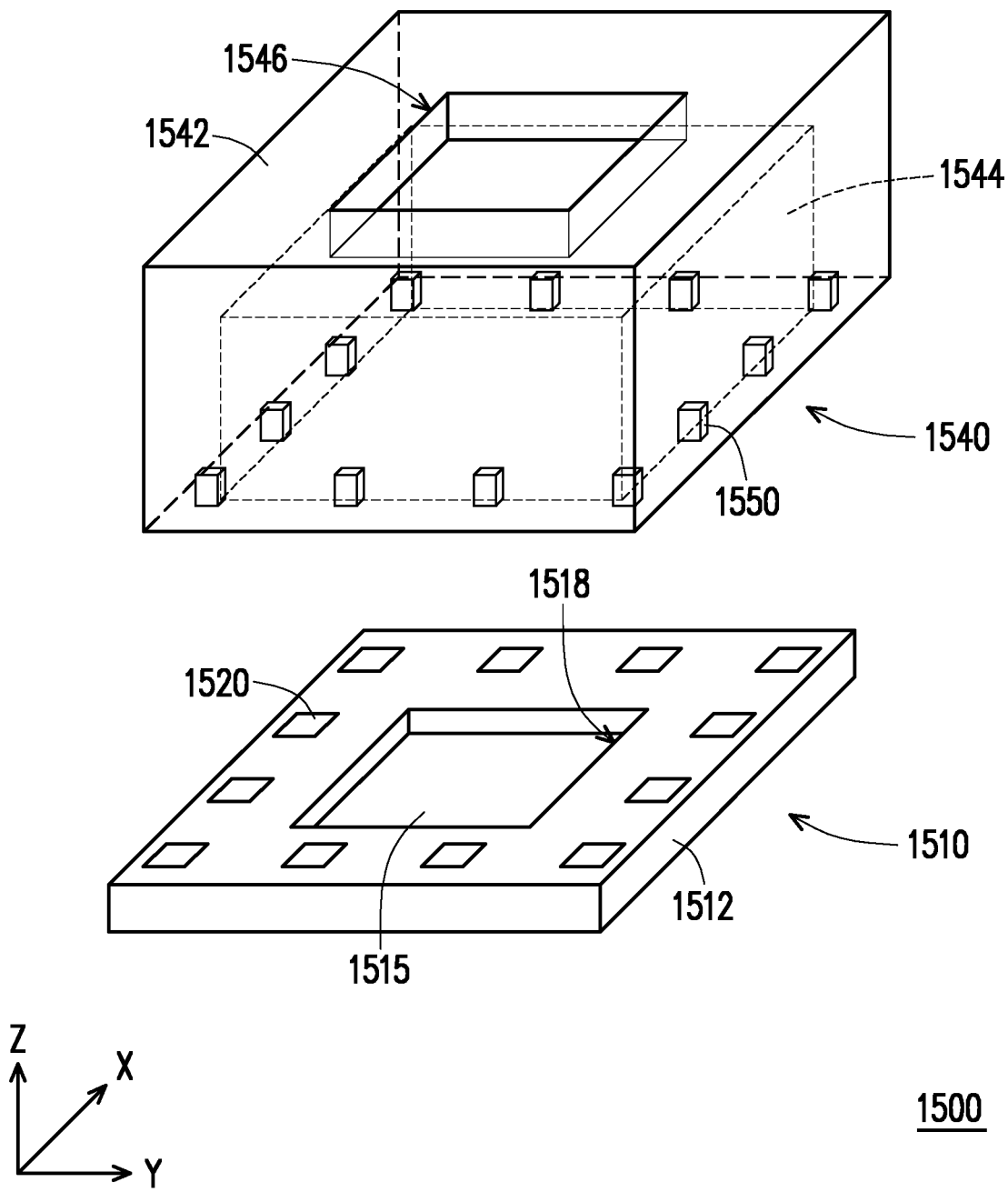
FIG. 5 is a schematic perspective view of a jig for manufacturing semiconductor packages according to some embodiments of the disclosure.

FIG. 5 is a schematic perspective view of a jig 1500 for manufacturing semiconductor packages according to some embodiments of the disclosure. The jig 1500 has a similar structure to the jig 1000A of FIG. 2A. A difference between the jig 1000A of FIG. 2A and the jig 1500 of FIG. 5 is that the jig 1500 of FIG. 5 is adapted to manufacture one larger semiconductor package (e.g., a large-scale semiconductor package). Therefore, even though the bottom pieces 1510, 1010 of the jigs 1500 and 1000A have substantially the same footprint (occupy the same space in the XY plane), the jig 1500 includes a single support plate 1515. In some embodiments, the support plate 1515 is optionally disposed on springs or other elastic elements (not shown), similarly to what was discussed above with respect to the support plates 1018 of FIG. 2A. In some alternative embodiments, the support plate 1515 is directly disposed on the base 1512, and may be even integrally formed with the base 1512. In some embodiments, the bottom piece 1510 of the jig 1500 does not include a plateau (such as the plateau 1014 of FIG. 2A). Rather, the base 1512 has a larger thickness in the annular peripheral region than in correspondence of the support plate 1515, so that a recess 1518 is formed in which the support plate 1515 is located. The elastic element(s) (not shown), when included, are disposed at the bottom of the recess 1518 to hold the support plate 1515. In some embodiments, the jig 1500 does not include a boat (such as the boat 1030 of FIG. 2A). In some embodiments, because the support plate 1515 is located within the recess 1518, when a package module (not shown) is disposed within the jig 1500, the recess 1518 may keep the package module in place. However, the disclosure is not limited thereto, and in some alternative embodiments, a boat (not shown) may also be included in the jig 1500, for example to adapt the jig 1500 to the manufacturing of semiconductor packages of different sizes and/or manufacture multiple semiconductor packages together. In some embodiments, the boat may be accommodated in the recess 1518, so that further alignment mechanisms need not be included. However, the disclosure is not limited thereto, and, in some alternative embodiments, alignment mechanisms (e.g., pins and corresponding holes), may also be included. In some embodiments, the upper piece 1540 has a similar structure to the upper piece 1040, but for including fewer (e.g., a single) opening 1546 in the cap 1542. In some embodiments, the jig 1500 may be provided with multiple upper pieces 1440, differing for the size or number of the openings 1446, so that package modules of different sizes may be disposed within the jig 1500 and still seal the opening 1446 during formation of the backside metallization layer and/or the TIM. Other aspects of the jig 1500 may be similar to what was previously described for the jig 1000A of FIG. 2A. For example, magnets 1520 are embedded in the base 1512, for example in the annular peripheral region, to hold together the upper piece 1540 and the bottom piece 1510 by interaction with the magnets 1550 embedded in the outer flanges 1544 of the upper piece 1540.

In some embodiments of the disclosure, the features of the jigs 1000A-G, 1400, 1500 of FIG. 2A to FIG. 2G, FIG. 4, and FIG. 5 may be combined in various manners. For example, even when multiple package modules are manufactured within a same jig as discussed for the jigs 1000A-G or 1400, the supporting plates 1018 or 1418 may be disposed within recesses of the respective bases 1012, 1412, as discussed for the jig 1500. Similarly, alignment pins such as 1019 or 1419 may be included on a support plate even when the support plate is accommodated in a recess of the base as in the jig 1500 of FIG. 5. As a further example, alternative fastening means may be used for the jigs 1400 and 1500, as described above for the jigs 1000E, 1000F of FIG. 2E and FIG. 2F. Also, in any one of the jigs 1000A-E, 1400, or 1500 the springs may be substituted by other elastic elements, such as the elastic pad 1016G of FIG. 2G.

Figure 6A:
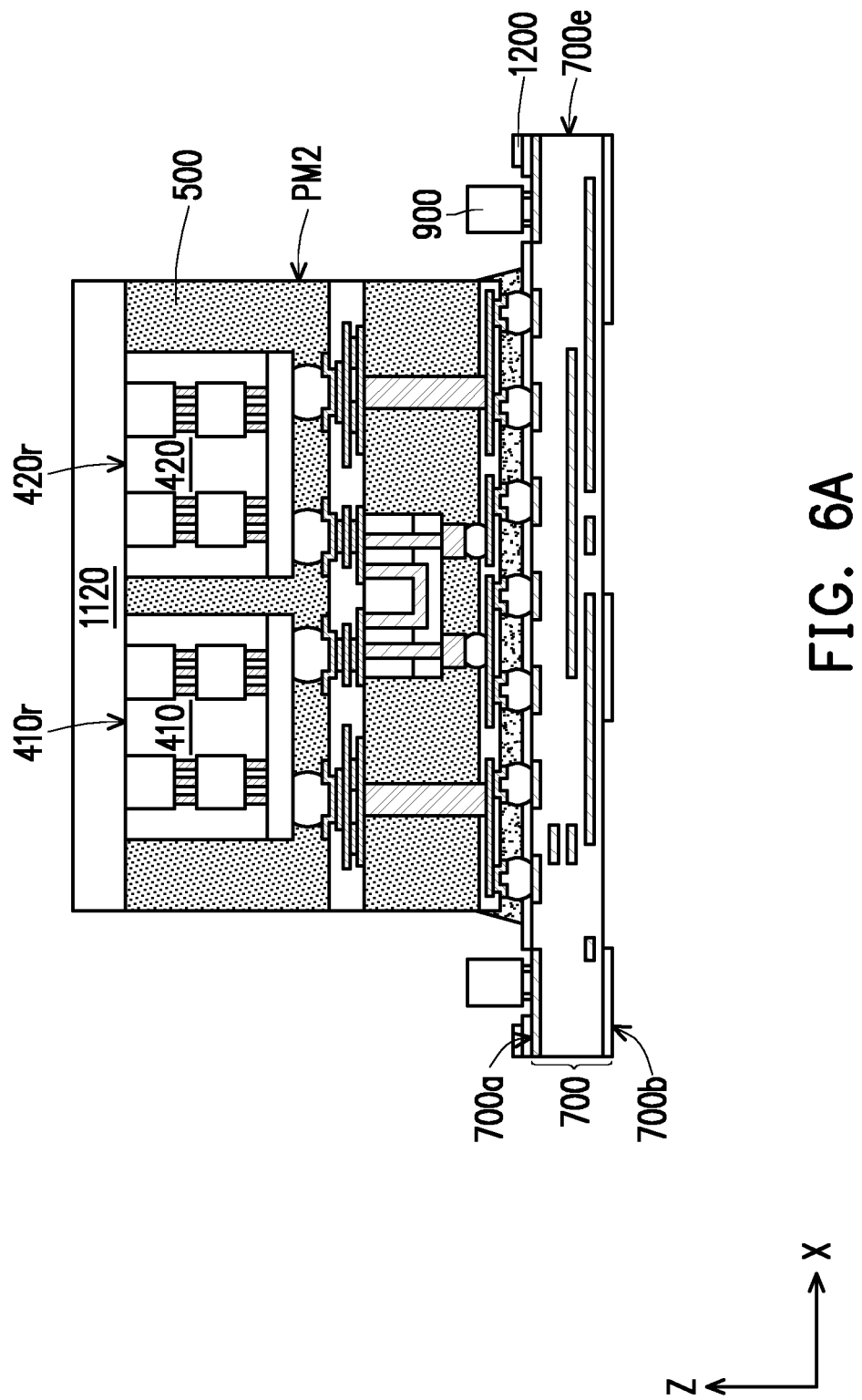
FIG. 6A to FIG. 6C are schematic cross-sectional views illustrating structures produced during a manufacturing process of a semiconductor package according to some embodiments of the disclosure.
Figure 6B:
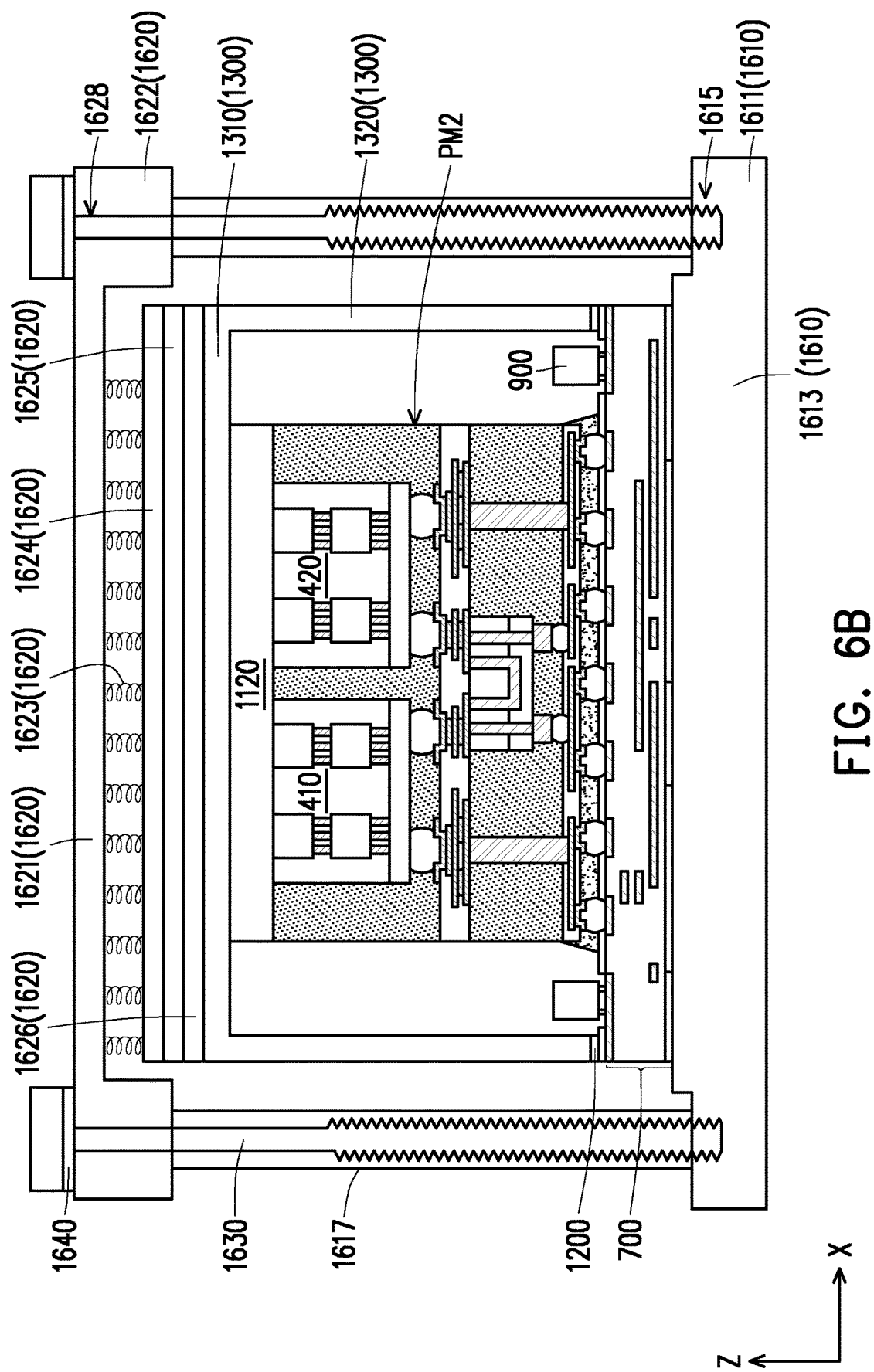
Figure 6C:
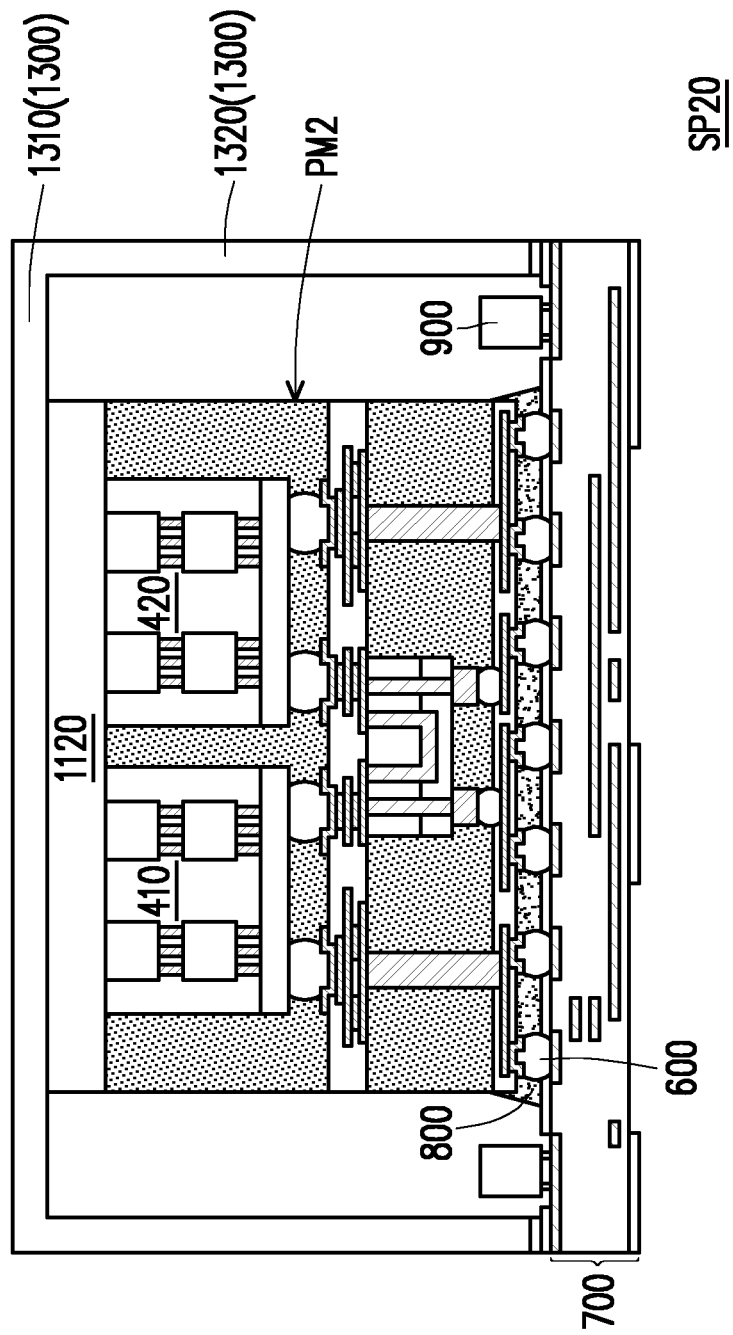
Figure 7:
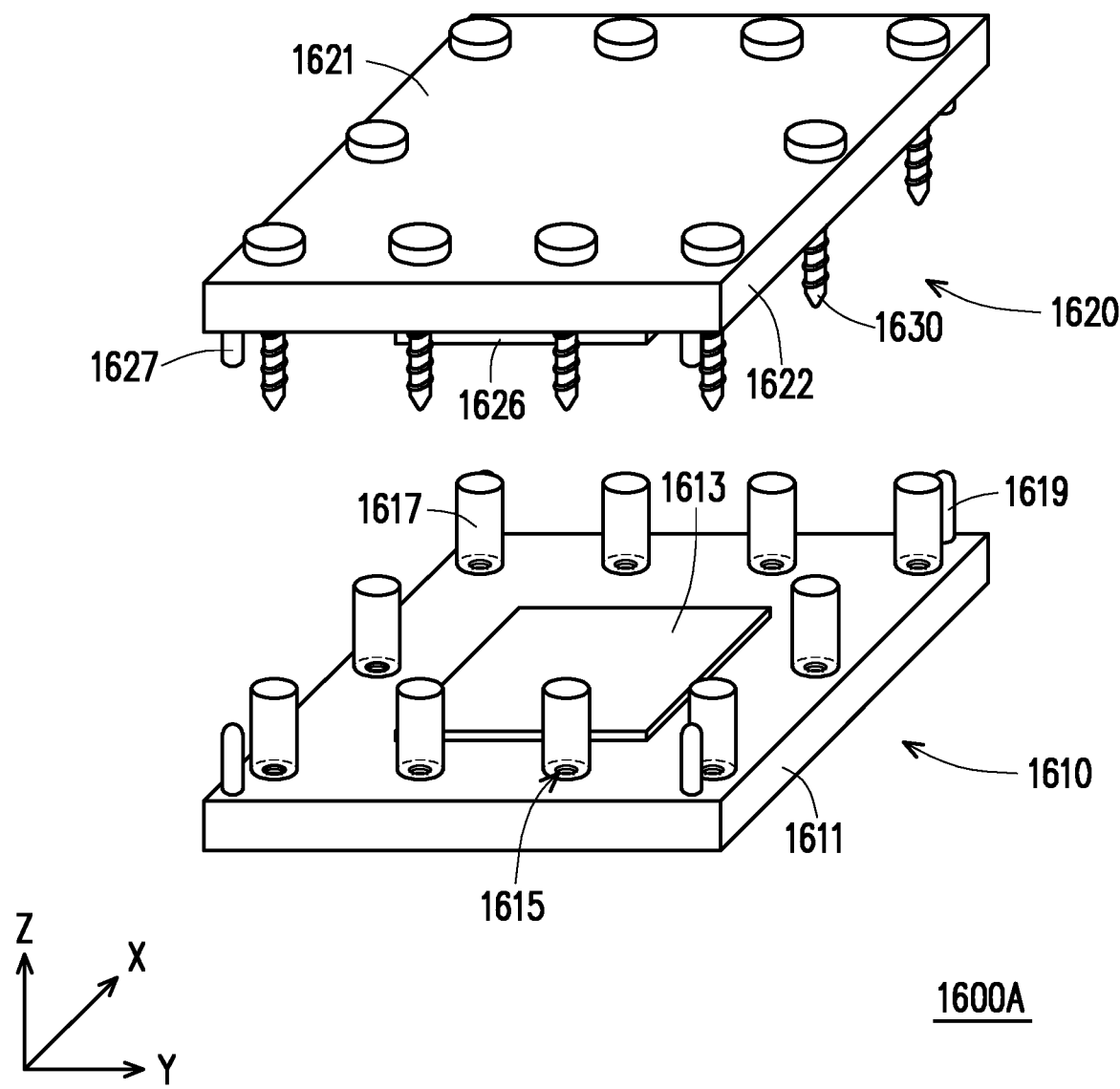
FIG. 7 is a schematic perspective view of a jig for manufacturing semiconductor packages according to some embodiments of the disclosure.

FIG. 6A to FIG. 6C are schematic cross-sectional views of structures produced during a manufacturing process of a semiconductor package SP20 according to some embodiments of the disclosure. FIG. 7 is a schematic perspective view of a jig 1600A employed in the manufacturing of the semiconductor package SP20. In FIG. 6A is illustrated a package module PM2 according to some embodiments of the disclosure having a TIM 1120 formed thereon. The package module PM2 may have a similar structure as previously discussed with respect to the package module PM1 of FIG. 1G, and may be manufactured following similar processes as previously described with reference to FIG. 1A to FIG. 1G. In some embodiments, the structure of FIG. 6A may be obtained from the structure of FIG. 1G by forming the TIM 1120 on the rear surfaces 410r, 420r of the semiconductor dies 410, 420, and by disposing the adhesive 1200 on the upper side 700a of the circuit substrate 700.

In some embodiments, referring to FIG. 6A and FIG. 6B, the metallic cover 1300 may be bonded to the circuit substrate 700 by employing a jig 1600A. For example, the metallic cover 1300 may be disposed on the circuit substrate 700, with the flanges 1320 contacting the adhesive 1200. Once the metallic cover 1300 is in contact with the adhesive, the adhesive 1200 may be pre-cured, for example at a temperature between 50-200° C., for example for a time in the range from 10 s to 900 s. In some embodiments, during the pre-curing step, the thickness along the Z direction of the TIM 1120 may be determined. Similarly, the pre-curing step may determine the warpage of the resulting semiconductor package.

FIG. 7 is a schematic perspective view of the jig 1600A. Referring to FIG. 6B and FIG. 7, in some embodiments, the package module PM2 with the metallic cover 1300, optionally pre-bonded, thereon may be disposed on the bottom piece 1610 of the jig 1600A. In some embodiments, the bottom piece 1610 of the jig 1600A includes a base 1611 and, optionally, a plateau 1613. The package module PM2 is disposed in a central region of the base 1611, on the plateau 1613 when the plateau 1613 is formed. The plateau 1613 may be encircled by an annular peripheral region of the base 1611. In some embodiments, the package module PM2 is disposed with the circuit substrate 700 contacting the bottom piece 1610. The upper piece 1620 of the jig 1600A may then be placed and fastened on the bottom piece 1610 of the jig 1600A, in such a manner that the package module PM2 and the metallic cover 1300 are compressed by action of the jig 1600A. In some embodiments, the upper piece 1620 includes a cap 1621 overlying the package module PM2 and the metallic cover 1300 and outer flanges 1622 disposed at the periphery of the cap 1621. In some embodiments, the outer flanges 1622 overlay the annular peripheral region of the base 1611. In some embodiments, the thickness along the Z direction of the outer flanges 1622 may be greater than the thickness along the Z direction of the cap 1621. That is, the upper piece 1620 may present a recess in correspondence of the cap 1621.

Figure 8:
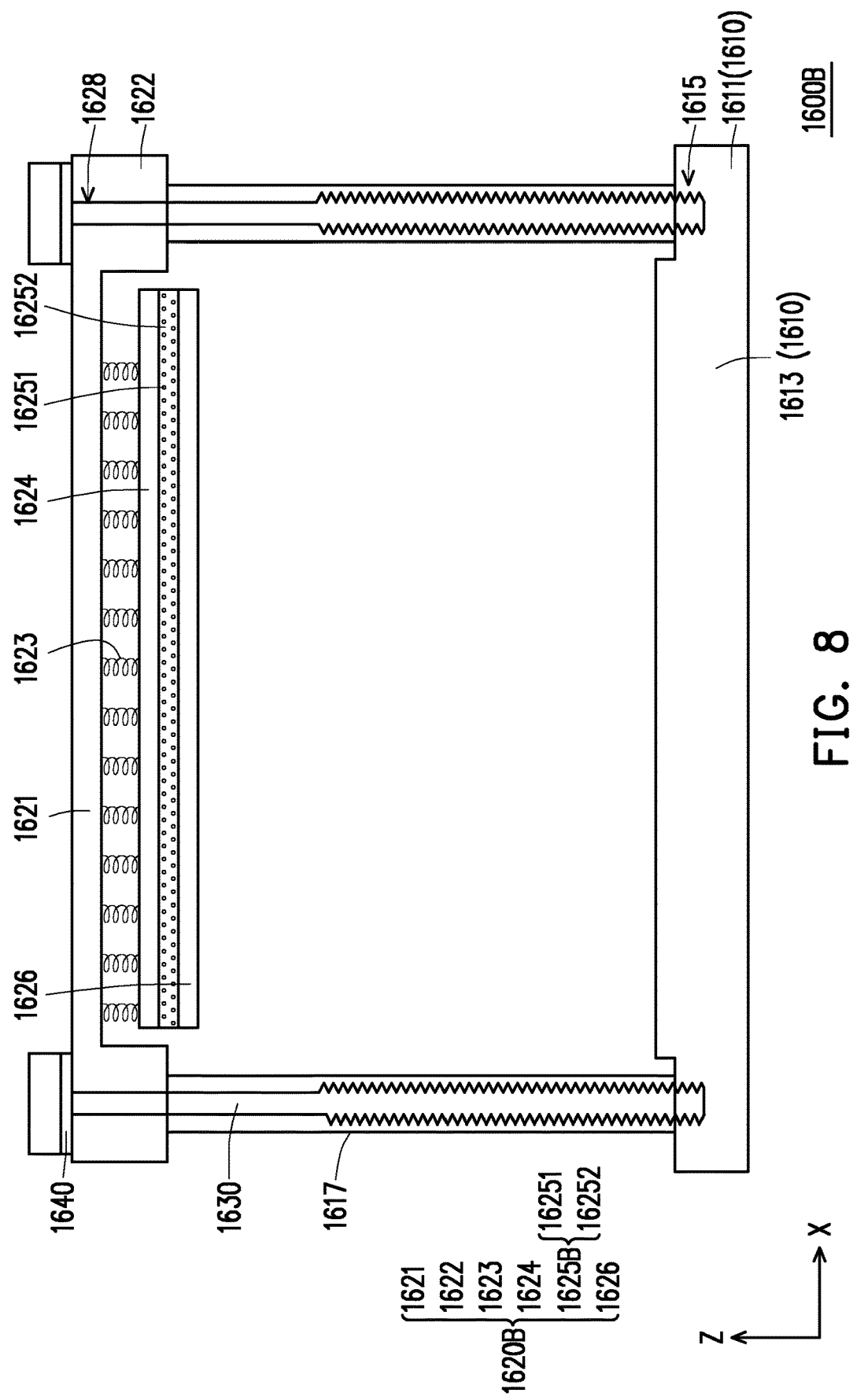
FIG. 8 is a schematic cross-sectional view of a jig for manufacturing semiconductor packages according to some embodiments of the disclosure.
Figure 9A:
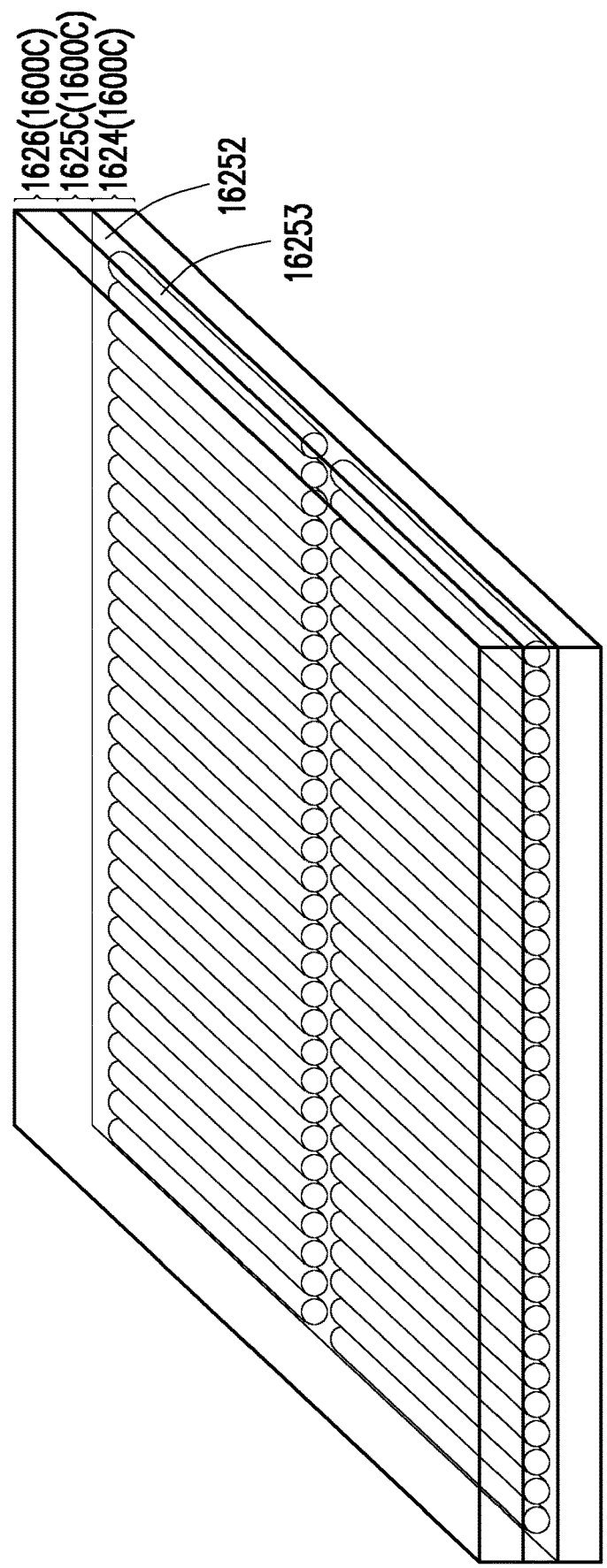
FIG. 9A to FIG. 9C are schematic cross-sectional views of some components of jigs for manufacturing semiconductor packages according to some embodiments of the disclosure.
Figure 9B:
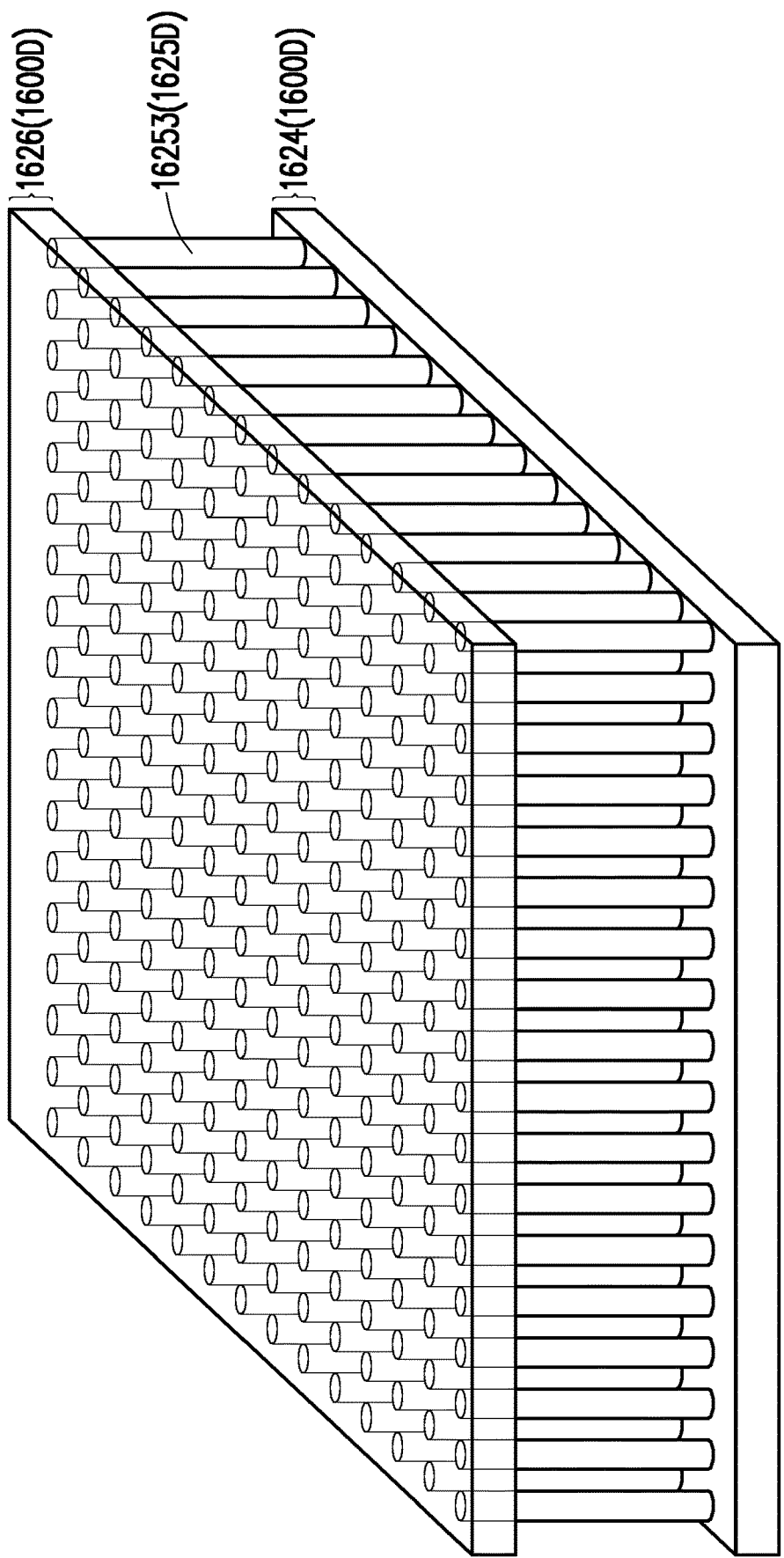
Figure 9C:
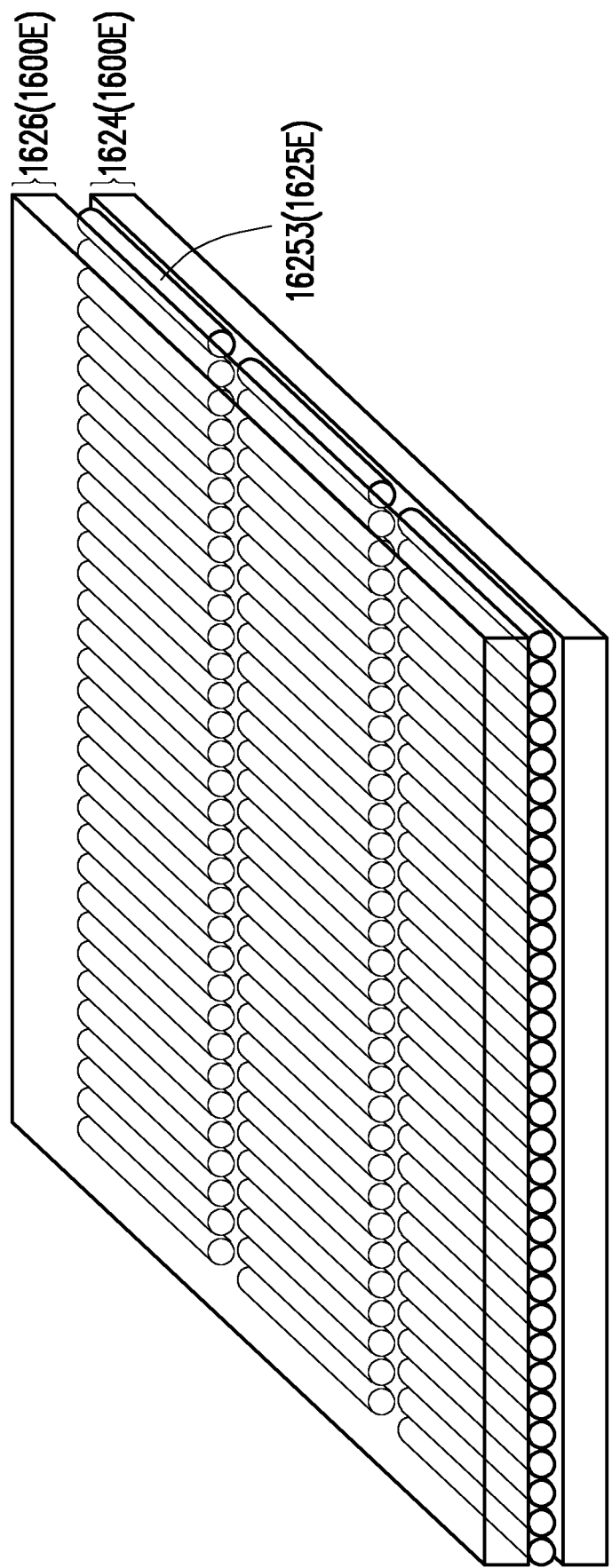
Figure 10A:
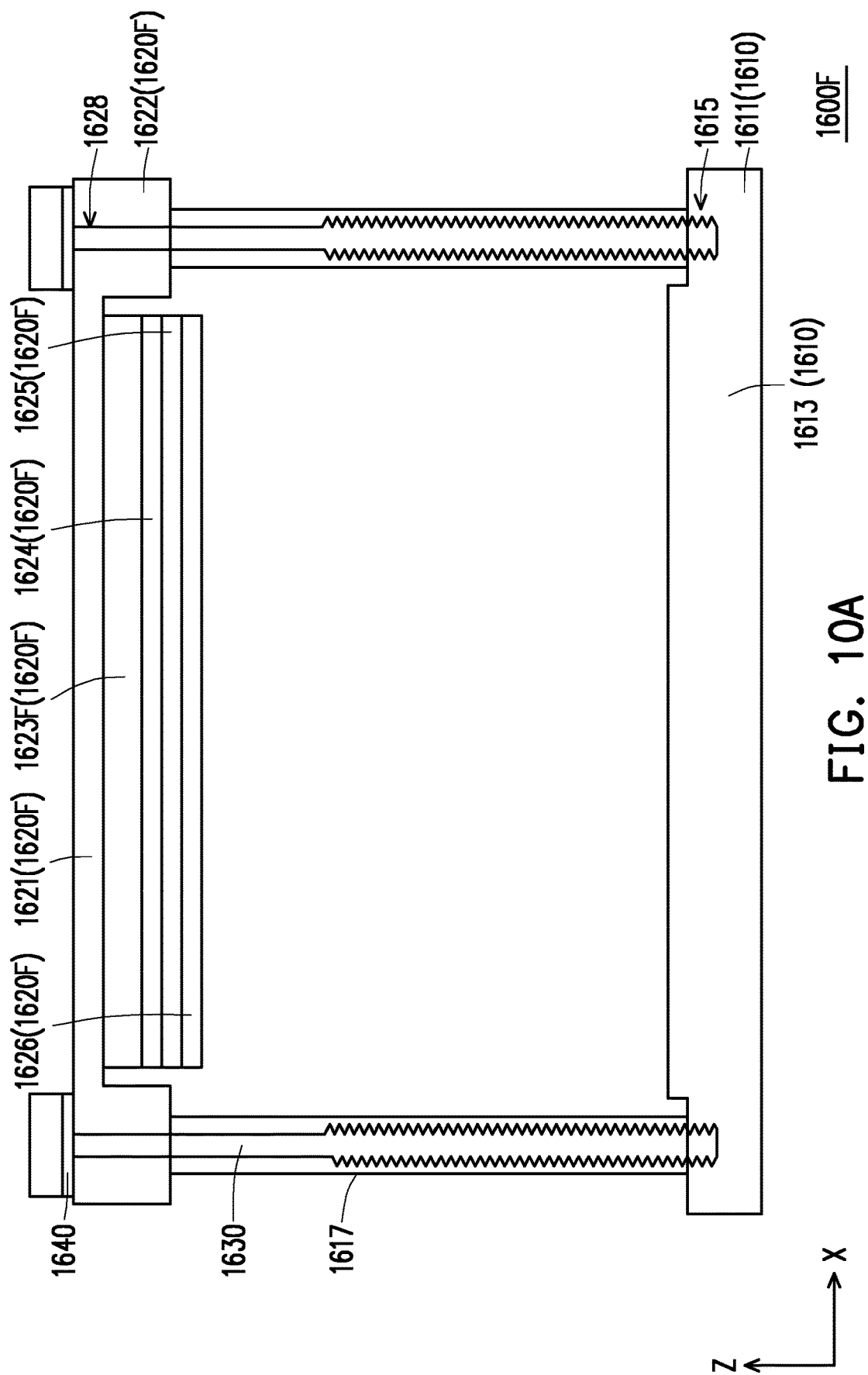
FIG. 10A and FIG. 10B are schematic cross-sectional views of jigs for manufacturing semiconductor packages according to some embodiments of the disclosure.
Figure 10B:
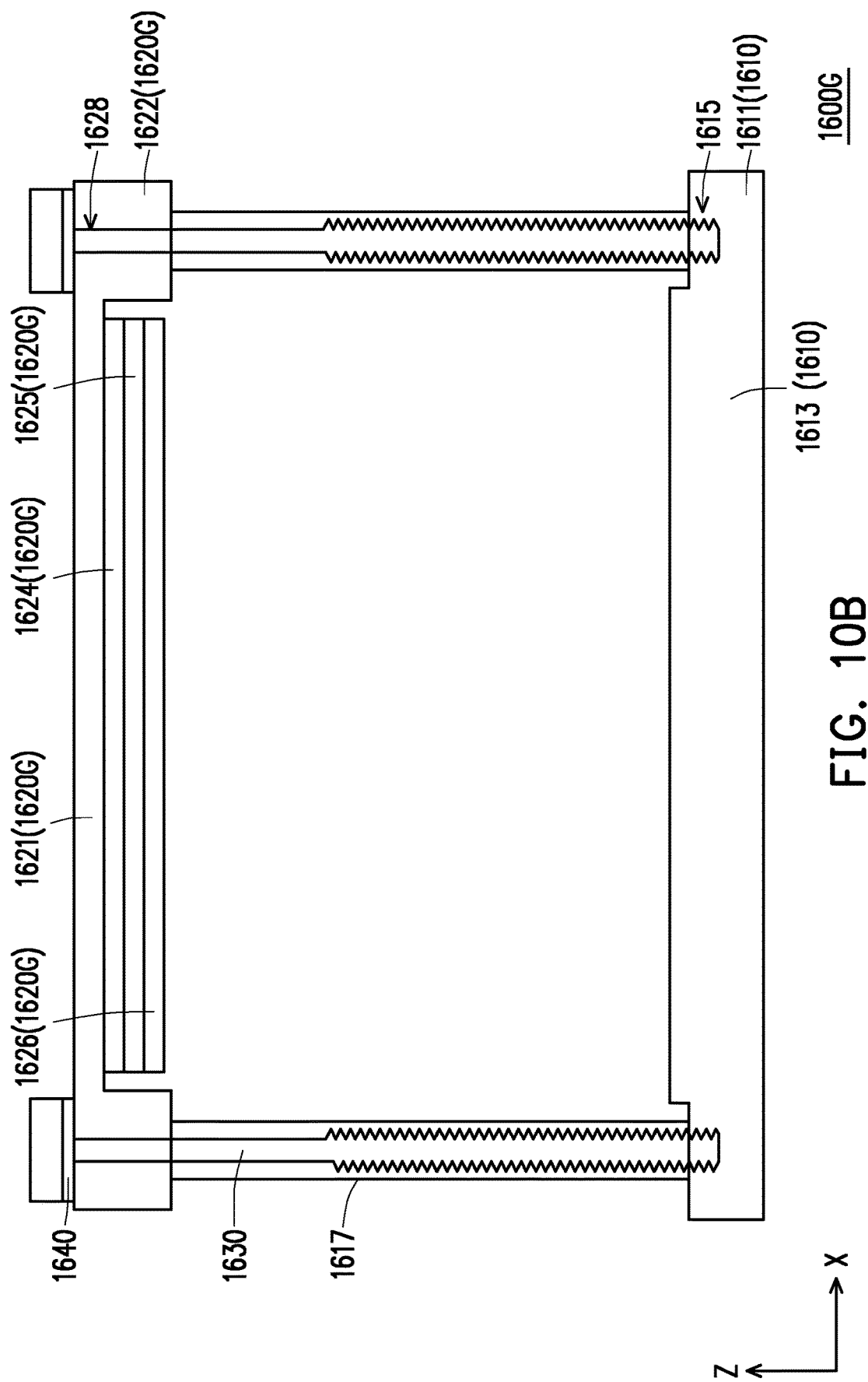

An array of springs 1623 may be disposed in the recess of the upper piece 1620. In some embodiments, one terminal of the springs 1623 is attached to the cap 1621 and the other terminal of the springs 1623 is attached to a rigid plate 1624. In some embodiments, there are about 0 to 200 springs 1623 per rigid plate 1624. In some embodiments, the rigid plate 1624 has an elastic pad 1625 and a release layer 1626 sequentially stacked on an opposite side with respect to the springs 1623. In some embodiments, the elastic pad 1625 may include a thermoplastic resin such as polyetherimide (PEI) or polyether ether ketone (PEEK), a (meth)acrylic resin, an epoxy resin, a combination thereof, or the like. In some embodiments, as illustrated for the jig 1600B of FIG. 8, the elastic pad 1625B may further include a carbon-based filler 16251 dispersed in one or more of the above resins 16252. In some embodiments, the carbon-based filler 16251 may be any one of diamond, graphite, amorphous carbon, or a combination thereof. In some alternative embodiments, the elastic pad 1625 may be formed of a carbon-based material, comprising graphite, amorphous carbon, or carbon nanotubes, for example. For example, in FIG. 9A are schematically illustrated the rigid plate 1624 and the elastic pad 1625C of a jig 1600C according to some embodiments of the disclosure. In the jig 1600C, the elastic pad 1625C include carbon nanotubes 16253 dispersed in a resin 16252, which resin 16252 may be selected from the materials listed above, for example. In some alternative embodiments, the elastic pad 1625D may be formed by carbon nanotubes 16253 attached to the rigid plate 1624 without being dispersed in a resin, as illustrated for the jig 1600D in FIG. 9B. The carbon nanotubes 16253 may be attached at one end to the rigid plate 1624, and, at the opposite end, to the release layer 1626. That is, the carbon nanotubes 16253 may be oriented perpendicular to the main extension plane of the rigid plate 1624 and the release layer 1626. In some alternative embodiments, as illustrated for the jig 1600E of FIG. 9C, the elastic pad 1625 may be all formed by carbon nanotubes 16253. The carbon nanotubes 16253 may be disposed parallel to each other laying on the main extension plane of the rigid plate 1624, sandwiched between the rigid plate 1624 and the release layer 1626. That is, the carbon nanotubes 16253 may be disposed with the walls contacting along the length dimension the rigid plate 1624 at one side and the release layer 1626 at an opposite side. In some embodiments, the rigid plate 1624 and the elastic pad 1625 exercise pressure on the metallic cover 1300 by action of the springs 1623. In some alternative embodiments, elastic elements other than springs may be disposed between the rigid plate 1624 and the cap 1621. For example, in the jig 1600F illustrated in FIG. 10A, the upper piece 1620F includes a compressible pad 1623F disposed between the cap 1621 and the rigid plate 1624. In some yet alternative embodiments, as illustrated for the jig 1600G of FIG. 10B, the rigid plate 1624 may be directly connected to the cap 1621, and the pressure on the package module PM2 may be regulated by setting the distance of the upper piece 1620G and the bottom piece 1610. In some embodiments, the release layer 1626 is included to prevent or reduce the likelihood of the metallic cover 1300 adhering to the elastic pad 1625. In some embodiments, the release layer 1626 may include a polymeric material, such as polyimide, (meth)acrylate, or epoxy resins. In some embodiments, the clamping force may be controlled by selecting springs 1623 (or pads 1623F) of appropriate spring (or elastic) constant. In some embodiments, the rigid plate 1624, the rubber pad 1625 and the release layer 1626 have a similar footprint in the XY plane as the metallic cover 1300, so that the upper piece 1620 may exercise substantially uniform pressure. In some embodiments, the upper piece 1620 is tightened to the bottom piece 1610, for example via threaded screws 1630. In some embodiments, through holes 1628 are formed in the outer flanges 1622 through which screws 1630 are inserted. The threaded ends of the screws 1630 are received in threaded blind holes 1615 formed in the annular peripheral region of the bottom piece 1610. The cap of the screws 1630 rests on the outer flanges 1622, optionally with intervening washers 1640. In some embodiments, the washers 1640 may prevent the screws 1630 from biting the outer flanges 1622 when tightened. By adjusting the amount of tightening of the screws 1630, it is possible to set the pressing force exercised by the upper piece 1620 on the bottom piece 1610.

In some embodiments, alignment and height regulating mechanisms are disposed on the annular peripheral region of the basis 1611 and the outer flanges 1622. For example, height-setting sleeves 1617 may be formed around the threaded blind holes 1615 to receive the screws 1630. The height-setting sleeves 1617 may be hollow channels through which the screws 1630 pass before being received in the threaded blind holes 1615. The height-setting sleeves 1617 may be made of a rigid material, capable of withstanding the pressure exercised by the upper piece 1620 when the screws 1630 are tightened so as to set the distance between the upper piece 1620 of the jig 1600A and the bottom piece 1610 of the jig 1600A. In some embodiments, alignment pins 1619 are formed on the bottom piece 1610, for example at the corners of the annular peripheral region. In some embodiments, the alignment pins 1619 may be received in alignment sleeves 1627 formed on the outer flanges 1622. In some alternative embodiments, the alignment pins 1619 may be received in alignment holes (not shown) formed in the outer flanges 1622. In some embodiments, the alignment holes are blind holes. In some alternative embodiments, the alignment holes are through holes.

In some embodiments, the bottom piece 1610 and the upper piece 1620 of the jig 1600A may be independently formed of any suitable material. For example, the materials for the bottom piece 1610 and the upper piece 1620 may independently include stainless steel, iron, copper, titanium, other metals, ceramic materials, or any material capable of withstanding the subsequent steps of the manufacturing process. In some embodiments, the jig 1600A may be subjected to an anodization or passivation treatment (e.g., with nickel) to enhance its environmental resistance and reduce interferences in subsequent manufacturing steps.

In some embodiments, the package module PM2 and the metallic cover 1300 may be kept in the jig 1600A during curing of the adhesive 1200 and the TIM 1120. In some embodiments, pressure is exercised on the metallic cover 1300 and the package module PM2 during the curing step, by action of the jig 1600A according to the mechanisms described above. In some embodiments, the curing may be performed at a temperature in the range from 125 to 150° C., with a clamping force of about 0.1 to 150 kgf. In some embodiments, the springs 1623 may increase uniformity of the applied force on the metallic cover 1300. In some embodiments, the height-setting sleeves 1617 may increase uniformity of the applied force. After curing, the jig 1600A may be opened, for example by untightening the screws 1630 and removing the upper piece 1620, and the semiconductor package SP 20 (illustrated, e.g., in FIG. 6C) may be recovered. In some embodiments, by keeping the semiconductor package SP20 in the jig 1600A during the curing step, the contact area between the TIM 1120 and the metallic cover 1300 may increase. In some embodiments, the contact area may be measured by scanning the semiconductor package SP20, for example with ultrasounds. In some embodiments, the increased contact area may enhance the thermal performances of the semiconductor package SP20. For example, the area coverage of the TIM 1120 after bonding of the metallic cover 1300 as measured by ultrasound scan may increase of about 40% with respect to a case in which the jig 1600A is not used. In some embodiments, the area coverage of the TIM 1120 observed upon using the jig 1600A to bond the metallic cover 1300 may be close to 100%, for example about 99%. In some embodiments, the stability of the semiconductor package SP20 may also increase. For example, when the jig 1600A is used during the curing step, less delamination of the TIM 1120 and the metallic cover 1300 may be observed after stress tests are conducted on the semiconductor package SP20. For example, a decrease of the area coverage of the TIM 1120 of about 3% may be observed for semiconductor packages manufactured using a jig such as the jig 1600A. By comparison, for packages manufactured without using a jig such as the jig 1600A, a decrease in area coverage of about 30% of the original value may be observed upon performance of similar stress tests. In some embodiments, use of the jig 1600A is compatible with an automated process. That is, assembly and disassembly of the jig 1600A may be performed in an automated manner, for example, without the need of human intervention.

It should be noted that while in FIG. 7 the jig 1600A is illustrated as being designed for a single package module, the disclosure is not limited thereto. For example, multiple arrays of springs 1623 or compressible pads 1623F may be attached to the cap 1621, and each array may be connected to a dedicated rigid plate 1624, elastic pad 1625 and release layer 1626. Corresponding plateaus 1613 may be formed on the base 1611. In some embodiments, features of the several embodiments described above may be combined as appropriate. For example, any one of the elastic pads 1625 and 1625B-E of FIG. 7 to FIG. 9B may be used as the elastic pads 1016G of FIG. 2G. As another example a boat (not shown) similar to the boats 1030, 1030B, 1030C, 1030D, 1430 of the jigs 1000A-G, 1400 of FIG. 2A to FIG. 2G and FIG. 4 may be optionally included on the bottom pieces 1610 of the jigs 1600A-G of FIG. 7 to FIG. 10B to keep the package module(s) in place. What is more, while the disclosure has presented the jigs 1000A-G of FIG. 2A to FIG. 2G, and the jigs 1400, 1500 of FIG. 4 and FIG. 5, with respect to the manufacturing of different semiconductor packages than the jigs 1600A-G of FIG. 7 to FIG. 10B (e.g., the semiconductor packages SP10 of FIG. 1M and SP20 of FIG. 6C), the disclosure is not limited thereto. In some embodiments, a first jig such as one of the jigs 1000A-G, 1400 or 1500 may be used to form the backside metallization layer 1100 on a top surface of a package module, and a second jig such as one of the jigs 1600A-G may be used during the subsequent attachment of the metallic cover.

Figure 11A:
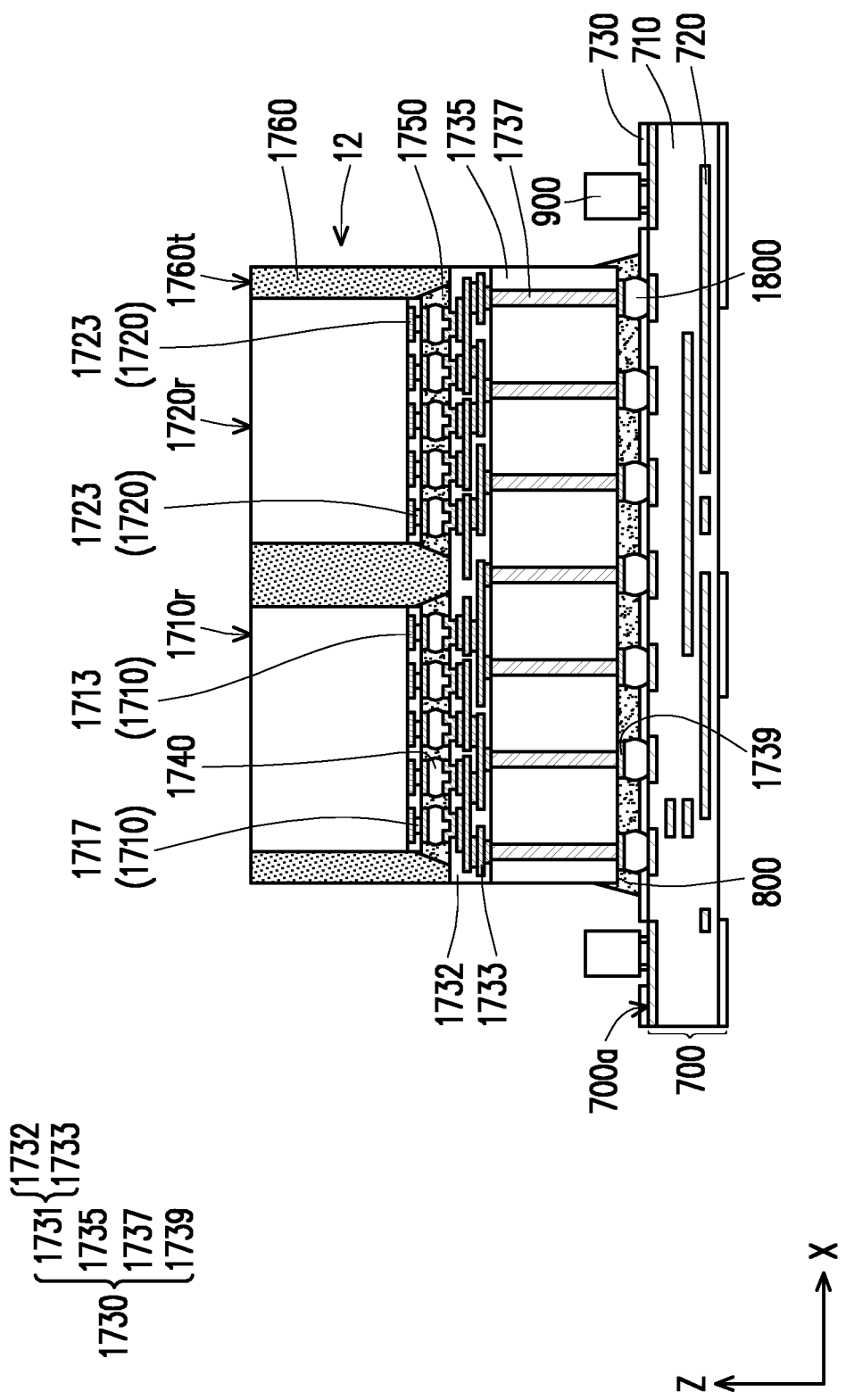

FIG. 11A to FIG. 11F are schematic cross-sectional views of structures formed during a manufacturing method of a semiconductor package SP30 according to some embodiments of the disclosure. The manufacturing of the semiconductor package SP30 may be similar to what was previously discussed for the semiconductor packages SP10 and SP20, and aspects not explicitly addressed in the following may be taken to be similar. In FIG. 11A, a package module PM3 is provided. In some embodiments, the package module PM3 may be formed upon bonding the packaged dies 12 to the circuit substrate 700. In some embodiments, the packaged dies 12 are a Chip-on-Wafer package, including semiconductor dies 1710, 1720 bonded to an interposer 1730, for example by micro-bumps 1740. The semiconductor dies 1710, 1720 may have a similar structure and perform similar functions to the semiconductor dies 410, 420 (illustrated, e.g., in FIG. 1D) previously described. In some embodiments, the semiconductor dies 1710, 1720 are disposed on the interposer 1730 with the respective contact pads 1713, 1723 and, if included, contact posts 1717, 1727 directed towards the interposer 1730. The interposer 1730 may include an interconnection layer 1731 including a dielectric layer 1732 and conductive patterns 1733 extending through the dielectric layer 1732. The micro-bumps 1740 may connect the conductive patterns 1733 to the conductive pads 1713, 1723 or conductive posts 1717, 1727. The interconnection layer 1731 may be formed on a semiconductor substrate 1735 through which through semiconductor vias (TSVs) 1737 extend. Contact pads 1739 may be disposed on an opposite side of the semiconductor substrate 1735 with respect to the semiconductor dies 1710, 1720. The TSVs 1737 may establish electrical connection between the conductive patterns 1733 and the contact pads 1739. One or more portions of underfill 1750 may be disposed between the semiconductor dies 1710, 1720 and the interposer 1730 to surround the micro-bumps 1740. An encapsulant 1760 may be formed on the interposer 1730 to laterally wrap the semiconductor dies 1710, 1720 and the underfills 1750. In some embodiments, rear surfaces 1710r, 1720r of the semiconductor dies 1710, 1720 and the top surface 1760t of the encapsulant 1760 are substantially at the same level height along the Z direction. In some embodiments, the interposer 1730 with the semiconductor dies 1710, 1720 bonded thereon is disposed on the circuit substrate 700, and is connected to the circuit substrate 700 through connective terminals 1800, for example. An underfill 800 may be disposed between the packaged dies 12 and the circuit substrate 700 to surround the connective terminals 1800. In some embodiments, the passive devices 900 are disposed on a same side 700a of the circuit substrate 700 with respect to the packaged dies 12.

Figure 11B:
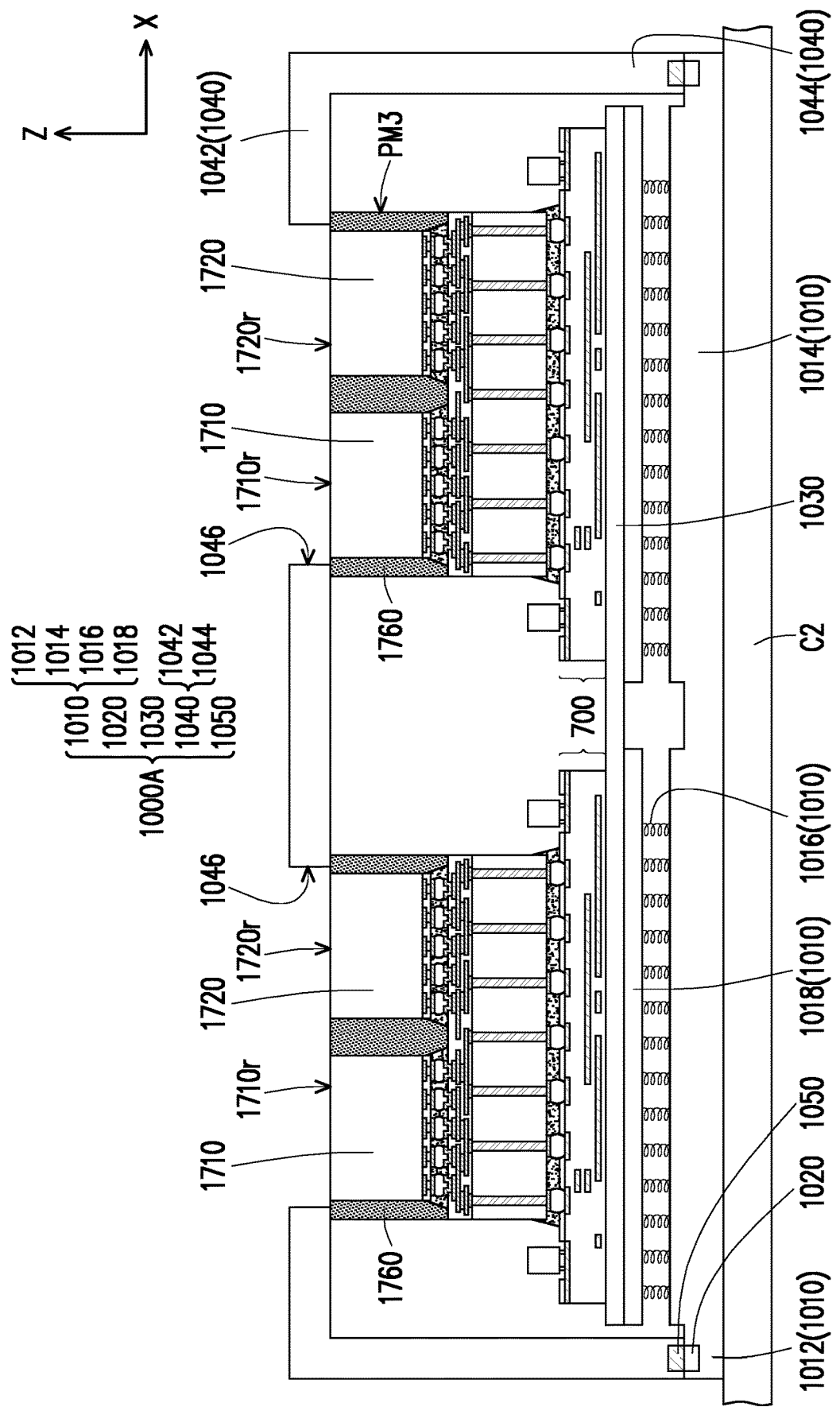

In FIG. 11B, one or more package modules PM3 are disposed within the jig 1000A, similar to what was previously discussed with reference to FIG. 1H and FIG. 1I. Briefly, the package modules PM3 are disposed on the bottom piece 1010 of the jig 1000A, for example one package module PM3 per support plate 1018. The package modules PM3 are disposed on the bottom piece 1010 with the circuit substrate 700 directed towards the bottom piece 1010. The boat 1030 may help keeping the package module PM3 in place on the bottom piece 1010. Similarly to what was previously described, the upper piece 1040 of the jig 1000A is removably secured to the bottom piece 1010, for example via paired magnets 1020, 1050 embedded in the base 1012 of the bottom piece 1010 and the outer flanges 1044 of the upper piece 1040, respectively. For the package module PM3 as well, the rear surfaces 1710r, 1720r of the semiconductor dies 1710, 1720 are exposed by the openings 1046 formed in the cap 1042 of the upper piece 1040. In some embodiments, the package modules PM3 are pressed against the upper piece 1040, so that the cap 1042 may contact the encapsulant 1760 of the package modules PM3 to seal the bottom of the openings 1046.

Figure 11C:
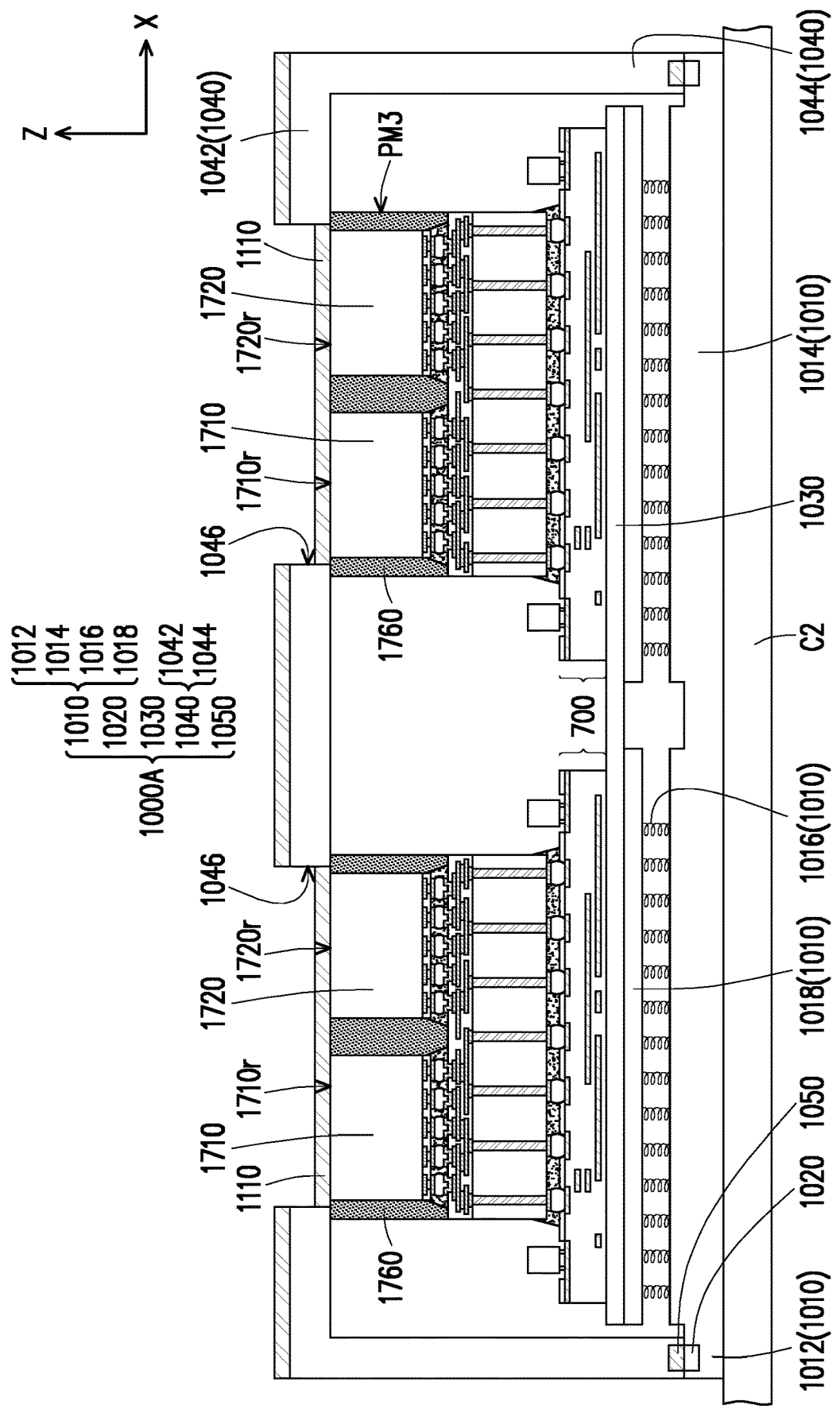
Figure 11D:
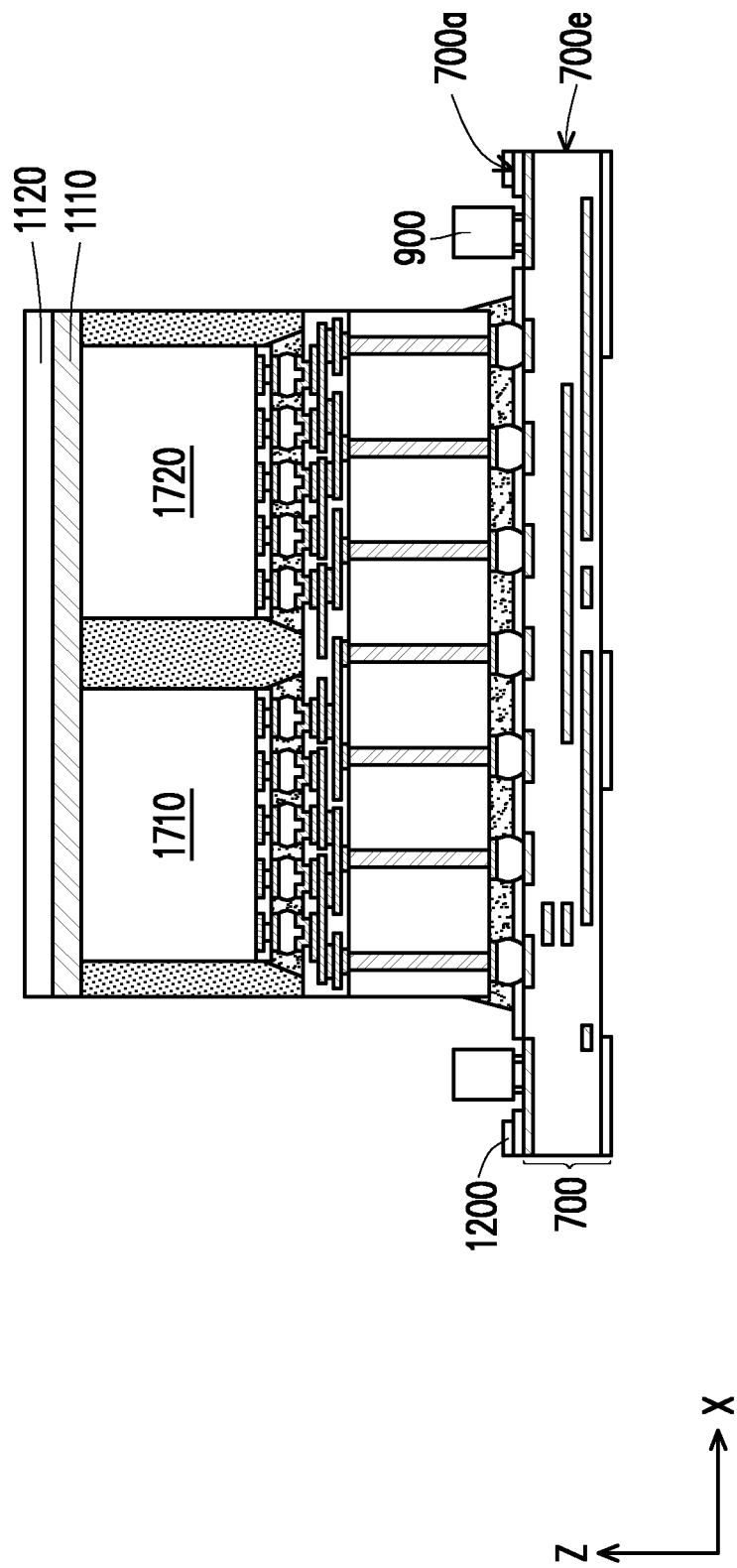

In FIG. 11C, backside metallization layers 1110 are formed in the openings 1046, on the rear surfaces 1710r, 1720r of the semiconductor dies 1710, 1720, and, possibly, on the encapsulant 1760. As previously described, because the package modules PM3 are pressed against the cap 1042 to seal the openings 1046 (for example, by action of the springs 1016), the material of the backside metallization layer 1110 may be selectively formed on the top surfaces of the package modules PM3, without seeping in and be deposited in other regions of the package modules PM3 (e.g., on the circuit substrates 700). Referring to FIG. 11C and FIG. 11D, in some embodiments, the package modules PM3 are recovered from the jig 1000A, and the TIM 1120 is then disposed on the backside metallization layer 1110. In some embodiments, the adhesive 1200 is disposed on the upper side 700a of the circuit substrate 700, in proximity of the outer edge 700e of the circuit substrate 700.

Figure 11E:
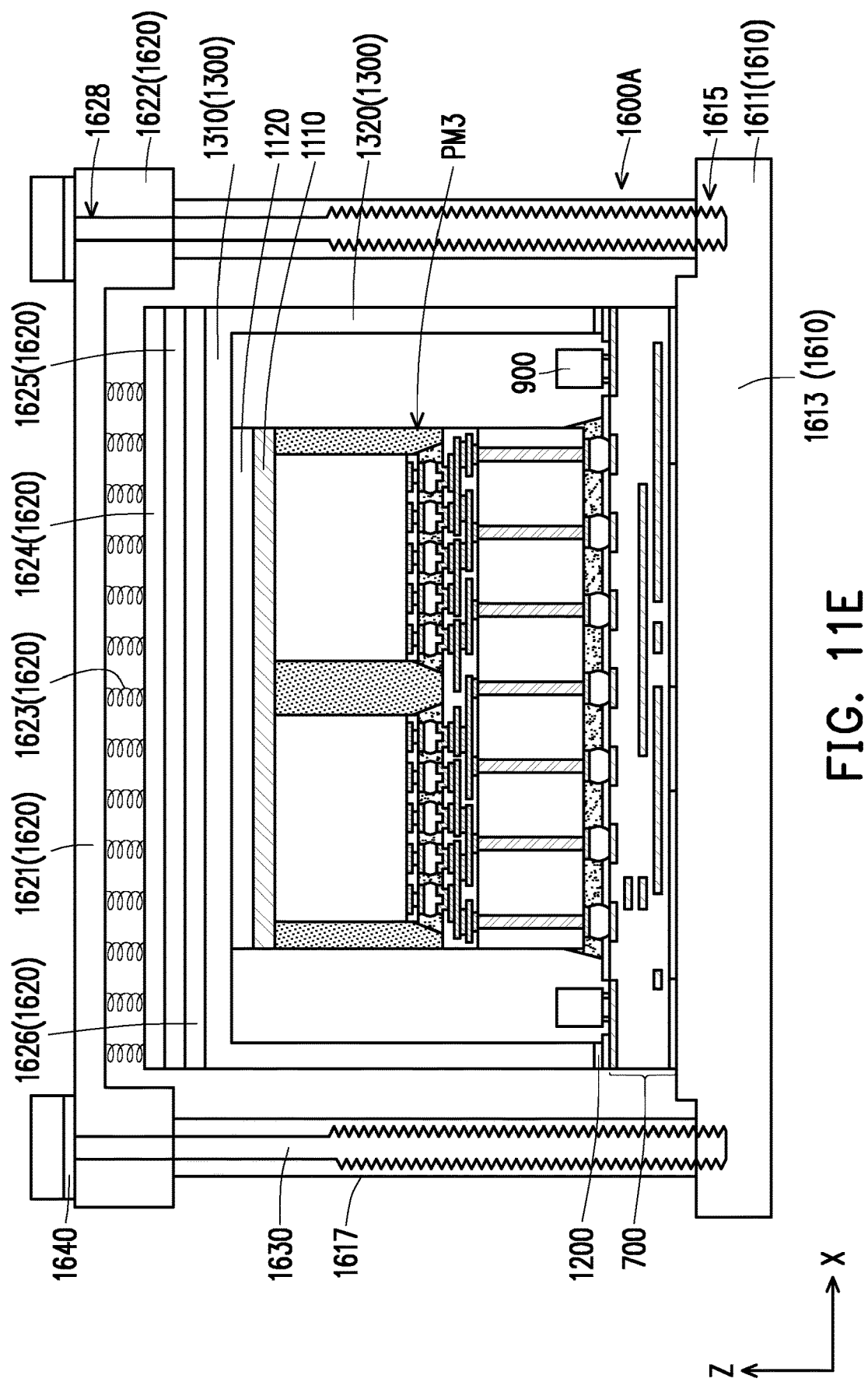
Figure 11F:
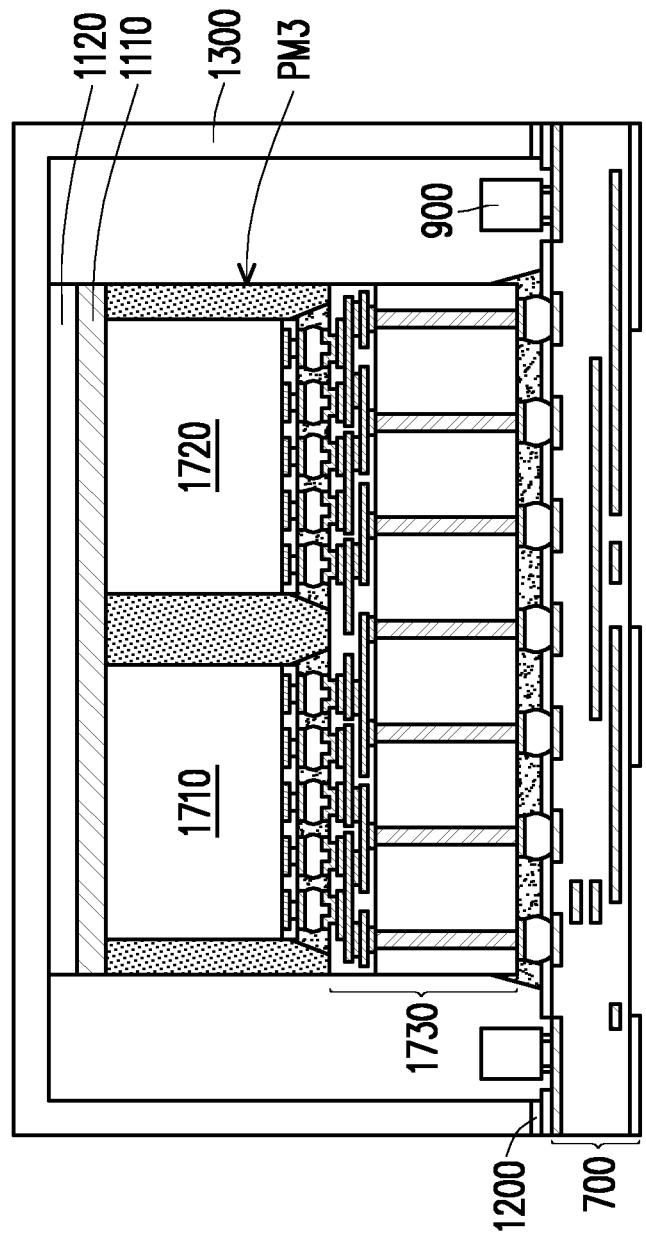

In FIG. 11E, the metallic cover 1300 is disposed on the circuit substrate 700, contacting the adhesive 1200 and the TIM 1120. The package module PM3 with the metallic cover 1300 (possibly, pre-bonded) is disposed on the bottom piece 1610 of a jig such as the jig 1600A. The upper piece 1620 of the jig 1600A is disposed on the bottom piece 1610 to clamp the package module PM13 to exercise pressure while curing the adhesive 1200, similarly to what was previously described with reference to FIG. 6B and FIG. 6C. Referring to FIG. 11F, after curing the adhesive 1200, the semiconductor package SP30 can be recovered from the jig 1600A.

It should be noted, that while the jigs 1000A and 1600A were illustrated in the process of FIG. 11A to FIG. 11F, the disclosure is not limited thereto, and any other jig according to the disclosure may be used depending on production requirements.

According to some embodiments of the disclosure, jigs for manufacturing of semiconductor packages are provided. The jigs include an upper piece and a bottom piece adapted to receive the package being fabricated in between. When the package is disposed in between the pieces of the jigs, a compressive force is exerted on the package. The compressive force may be produced by setting the distance between the upper piece and the lower piece of the jig, taking into account the size (e.g., the height) of the package. In some embodiments, elastic elements may be included to press the package against the upper piece of the jig. In some embodiments, the compressive action on the package may be used to ensure that openings formed in the upper piece are sealed, exposing only a desired surface of the package at their bottom. By doing so, the jig may be used as a mask during deposition of material on the exposed surface of the package, while protecting other surfaces. In some embodiments, the compressive action on the package may be exercised during curing to ensure satisfactory adhesion between a metallic cover and a thermal interface material disposed on the rear surface of the package.

In accordance with some embodiments of the disclosure, a jig for manufacturing a semiconductor package includes a bottom piece and an upper piece. The bottom piece includes a base, a support plate, and at least one elastic connector. The support plate is located in a central region of the base. The at least one elastic connector is interposed between the support plate and the base. The upper piece includes a cap and outer flanges. The cap overlays the support plate when the upper piece is disposed on the bottom piece. The outer flanges are disposed at edges of the cap, connected with the cap. The outer flanges contact the base of the bottom piece when the upper piece is disposed on the bottom piece. The cap includes an opening which is a through hole. When the upper piece is disposed on the bottom piece, a vertical projection of the opening falls entirely on the support plate.

In accordance with some embodiments of the disclosure, a jig for manufacturing a semiconductor package includes a bottom piece, and upper piece, and screws. The bottom piece includes a base. The base has a central region and a peripheral region encircling the central region. Threaded holes are formed in the peripheral region of the base. The upper piece includes a cap, at least one spring, and outer flanges. The cap extends over the central region of the base when the upper piece is disposed over the bottom piece. The at least one spring has a terminal connected to the cap and the other terminal connected to a rigid plate. The outer flanges are disposed at edges of the cap. Through holes are formed in the outer flanges. When the upper piece is mounted over the bottom piece, the screws extend across the outer flanges via the through holes to be tightened in the threaded holes of the bottom piece.

In accordance with some embodiments of the disclosure, a manufacturing method of a semiconductor package includes the following steps. A semiconductor die is bonded to a circuit substrate. The circuit substrate with the bonded semiconductor die is placed on a support plate of a bottom piece of a jig. An upper piece of the jig is placed on the bottom piece to close the jig, whereby the semiconductor die is pressed against the upper piece of the jig. The upper piece of the jig includes an opening, and a rear surface of the encapsulated semiconductor die is exposed by the opening. A thermally conductive material is deposited on the rear surface of the encapsulated semiconductor die within the opening. The upper piece is removed to open the jig.

In accordance with some embodiments of the disclosure, a manufacturing method of a semiconductor package includes the following steps. An adhesive material is disposed on a circuit substrate beside at least one semiconductor die bonded to the circuit substrate. A metallic cover is placed on the adhesive material. The metallic cover extends over the semiconductor die. The circuit substrate is disposed on a bottom piece of a jig. An upper piece of the jig is disposed over the bottom piece of the jig. The upper piece of the jig is tightened to the bottom piece of the jig. By doing so, the metallic cover is pressed against the circuit substrate and the semiconductor die. The adhesive material is cured while the jig presses the metallic cover against the circuit substrate and the semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor package, comprising:
   bonding a semiconductor die to a circuit substrate;
   placing the circuit substrate with the bonded semiconductor die on a support plate of a bottom piece of a jig;

placing an upper piece of the jig on the bottom piece to close the jig, whereby the semiconductor die is pressed against the upper piece of the jig, wherein the upper piece of the jig includes an opening, and a rear surface of the semiconductor die is exposed by the opening;

depositing a thermally conductive material on the rear surface of the semiconductor die within the opening; and removing the upper piece to open the jig.

2. The manufacturing method of claim 1, wherein the thermally conductive material includes a metallic material.

3. The manufacturing method of claim 1, wherein the thermally conductive material is further deposited on the upper piece of the jig.

4. The manufacturing method of claim 1, further comprising placing a metal boat on the bottom piece of the jig, wherein the metal boat includes an opening exposing the support plate of the bottom piece, and wherein the circuit substrate with the bonded semiconductor die is disposed on the support plate within the opening of the boat.

5. The manufacturing method of claim 1, further comprising:

disposing a thermal interface material on the thermally conductive material; and bonding a metallic cover to the circuit substrate, wherein the metallic cover contacts the thermal interface material.

6. The manufacturing method of claim 5, wherein bonding the metallic cover to the circuit substrate comprises:

disposing an adhesive on the circuit substrate;

placing the metallic cover on the adhesive;

disposing the circuit substrate with the bonded semiconductor die, the metallic cover, and the adhesive in a second jig;

tightening the second jig to exercise pressure on the metallic cover in a stacking direction of the metallic cover and the circuit substrate; and performing a heating step to cure the adhesive.

7. A manufacturing method of a semiconductor package, comprising:

providing a jig at least including an upper piece and a bottom piece separated from each other;

placing a package module on the bottom piece of a jig;

aligning the upper piece of the jig with the bottom piece of the jig by using fasteners, so that the upper piece of the jig and the bottom piece of the jig are held together, wherein the upper piece of the jig overlays the package module, the upper piece of the jig includes an opening, and a rear surface of the package module is exposed by the opening;

depositing a thermally conductive material on the rear surface of the package module within the opening; and removing the upper piece to expose the package module.

8. The manufacturing method of claim 7, wherein the fasteners comprise:

first magnets, entrenched in the bottom piece and having one surface exposed at a top surface of the bottom piece; and second magnets, entrenched in the upper piece and having one surface exposed at a bottom surface of the upper piece, wherein, when the upper piece is aligned with the bottom piece, the second magnets overlap with the first magnets.

9. The manufacturing method of claim 7, wherein the thermally conductive material includes a metallic material.

10. The manufacturing method of claim 7, wherein the thermally conductive material is further deposited on the upper piece of the jig.

11. The manufacturing method of claim 7, further comprising placing a metal boat on the bottom piece of the jig, wherein the metal boat includes an opening accommodating the package module.

12. The manufacturing method of claim 7, wherein the package module comprises a semiconductor die bonded onto a circuit substrate, and the semiconductor die and the circuit substrate are surrounded by the upper piece of the jig.

13. The manufacturing method of claim 12, further comprising:

disposing a thermal interface material on the thermally conductive material; and bonding a metallic cover to the circuit substrate, wherein the metallic cover contacts the thermal interface material.

14. The manufacturing method of claim 13, wherein bonding the metallic cover to the circuit substrate comprises:

disposing an adhesive on the circuit substrate;

placing the metallic cover on the adhesive;

disposing the circuit substrate with the bonded semiconductor die, the metallic cover, and the adhesive in a second jig;

tightening the second jig to exercise pressure on the metallic cover in a stacking direction of the metallic cover and the circuit substrate; and performing a heating step to cure the adhesive.

15. The manufacturing method of claim 14, wherein the second jig comprises a second upper piece and a second bottom piece, the second upper piece includes a rigid pad, an elastic pad, and a release layer sequentially stacked over a cap, wherein the release layer contacts the metallic cover when the second upper piece of the second jig is mounted on the second bottom piece of the second jig.

16. The manufacturing method of claim 15, wherein the second upper piece of the second jig further comprises an elastic connector disposed between the cap and the rigid pad.

17. The manufacturing method of claim 15, wherein the elastic pad comprises carbon nanotubes contacting at opposite sides the rigid pad and the release layer.

18. A manufacturing method of a semiconductor package, comprising:

providing a jig including an upper piece, a boat, and a bottom piece separated from each other;

aligning the boat of the jig with the bottom piece of the jig by using alignment mechanisms;

after placing the boat of the jig on the bottom piece, placing a package module on the bottom piece of a jig, wherein the boat is configured to have a first opening to accommodate the package module;

placing an upper piece of the jig on the bottom piece, so that the package module is pressed against the upper piece of the jig, wherein the upper piece of the jig includes a second opening, the second opening corresponds to the first opening, and a rear surface of the package module is exposed by the second opening;

depositing a thermally conductive material by using the upper piece of the jig as a mask; and removing the upper piece to form the package module with a backside metallization layer.

19. The manufacturing method of claim 18, wherein the aligning the boat of the jig with the bottom piece of the jig by using the alignment mechanisms comprises:

forming alignment pins on the bottom piece;

forming alignment holes on the boat;

aligning the alignment pins corresponding to the alignment holes; and inserting the alignment pins into the alignment holes to provide the alignment between the bottom piece and the boat.

20. The manufacturing method of claim 18, wherein the thermally conductive material includes a metallic material.

* * * * *